United States Patent
Chen et al.

(10) Patent No.: US 12,463,617 B2
(45) Date of Patent: Nov. 4, 2025

(54) ACOUSTIC RESONATOR

(71) Applicant: TEXAS INSTRUMENTS INCORPORATED, Dallas, TX (US)

(72) Inventors: Huiyao Chen, Hillsboro, OR (US);
Ting-Ta Yen, San Jose, CA (US);
Ricky A. Jackson, Richardson, TX (US); Keegan Martin, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 952 days.

(21) Appl. No.: 17/364,214

(22) Filed: Jun. 30, 2021

(65) Prior Publication Data
US 2023/0006635 A1    Jan. 5, 2023

(51) Int. Cl.
*H03H 9/02* (2006.01)
*H03H 3/02* (2006.01)
*H03H 3/08* (2006.01)
*H03H 9/17* (2006.01)

(52) U.S. Cl.
CPC .......... *H03H 9/02685* (2013.01); *H03H 3/02* (2013.01); *H03H 3/08* (2013.01); *H03H 9/0211* (2013.01); *H03H 9/17* (2013.01); *H03H 2003/025* (2013.01)

(58) Field of Classification Search
CPC ........ H03H 9/0211; H03H 9/17; H03H 9/175; H03H 9/25
See application file for complete search history.

(56) References Cited

U.S. PATENT DOCUMENTS

| 6,087,198 A | 7/2000 | Panasik |
| 6,548,962 B1 | 4/2003 | Shiokawa et al. |
| 7,199,683 B2 | 4/2007 | Thalhammer et al. |
| 8,291,559 B2 | 10/2012 | Heinze et al. |
| 8,593,234 B2 | 11/2013 | Bar et al. |
| 10,541,665 B2 | 1/2020 | Lee et al. |
| 10,574,184 B2 | 2/2020 | Jackson et al. |
| 10,622,966 B2* | 4/2020 | Yen .......................... H03H 9/171 |

(Continued)

FOREIGN PATENT DOCUMENTS

| CN | 113411065 A | * | 9/2021 | |
| CN | 112152581 B | * | 2/2022 | ............... H03H 3/02 |
| CN | 110417371 B | * | 6/2022 | ............... H03H 3/02 |

OTHER PUBLICATIONS

Chung, et al.: "Influence of surface roughness of Bragg reflectors on resonance characteristics of solidly-mounted resonators"; IEEE Transactions on Ultrasonics Ferroelectrics and Frequency Control; May 2007; DOI: 10.1109/TUFFC.2007.313—Source: PubMed.

*Primary Examiner* — J. San Martin
(74) *Attorney, Agent, or Firm* — Frank D. Cimino

(57) ABSTRACT

An integrated circuit (IC) resonator module for an IC package includes an acoustic resonator having a surface and a Bragg reflector adhered to the surface of the acoustic resonator. The Bragg reflector includes low impedance layers formed of a first material with a first acoustic impedance and a high impedance layer formed of a second material with a second acoustic impedance. The second acoustic impedance is greater than the first acoustic impedance. The Bragg reflector further includes a Bragg grating layer formed of randomly or periodically spaced patches of the second material separated by vias filled with the first material.

21 Claims, 19 Drawing Sheets

(56) References Cited

U.S. PATENT DOCUMENTS

| | | | |
|---|---|---|---|
| 11,146,230 B2* | 10/2021 | Dellas | H03H 3/02 |
| 2013/0038408 A1* | 2/2013 | Burak | H03H 9/02118 |
| | | | 333/187 |
| 2017/0033766 A1 | 2/2017 | Jacobsen et al. | |
| 2019/0341885 A1* | 11/2019 | Jackson | H03B 5/326 |
| 2020/0076366 A1 | 3/2020 | Bahr et al. | |
| 2020/0350889 A1 | 11/2020 | Smeys et al. | |
| 2021/0167752 A1* | 6/2021 | Caron | H03H 9/205 |
| 2023/0115689 A1* | 4/2023 | Link | H03H 9/17 |
| | | | 310/367 |

* cited by examiner

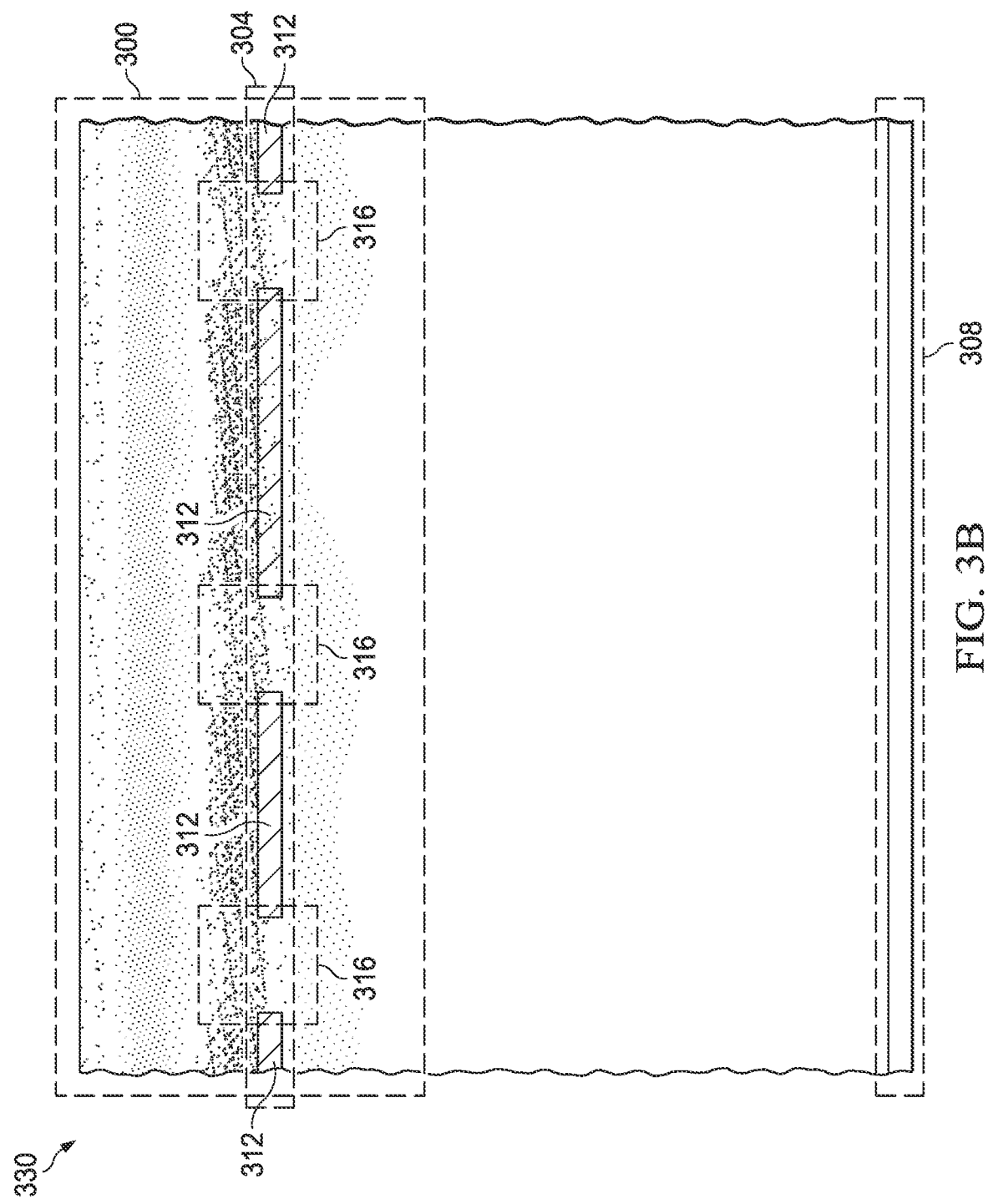

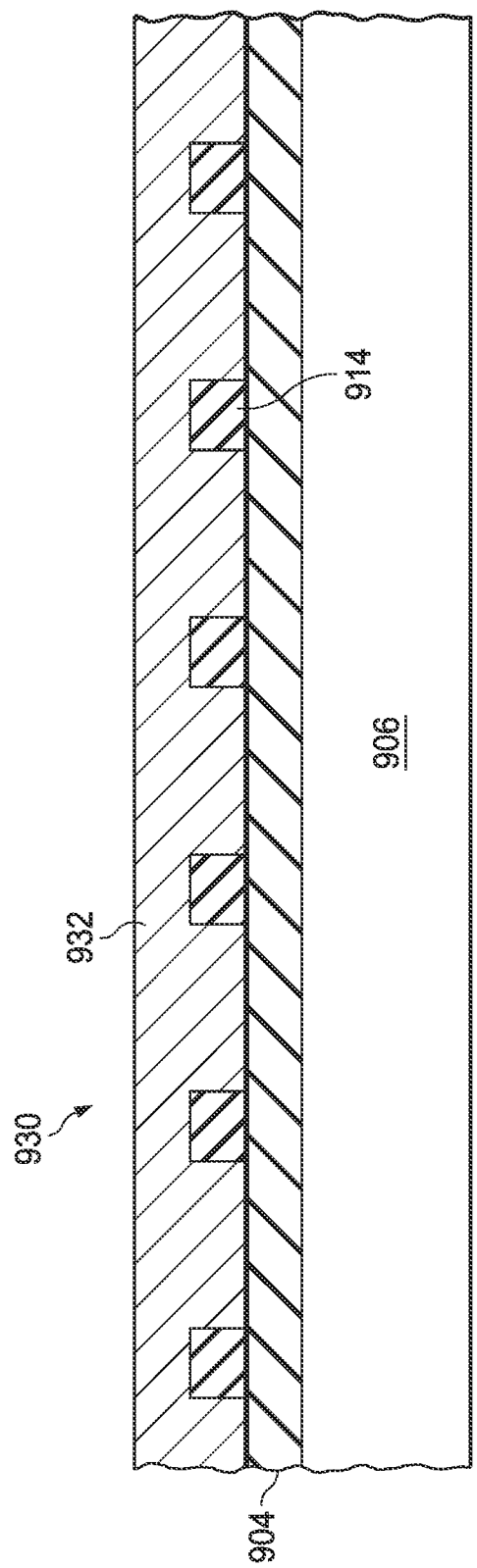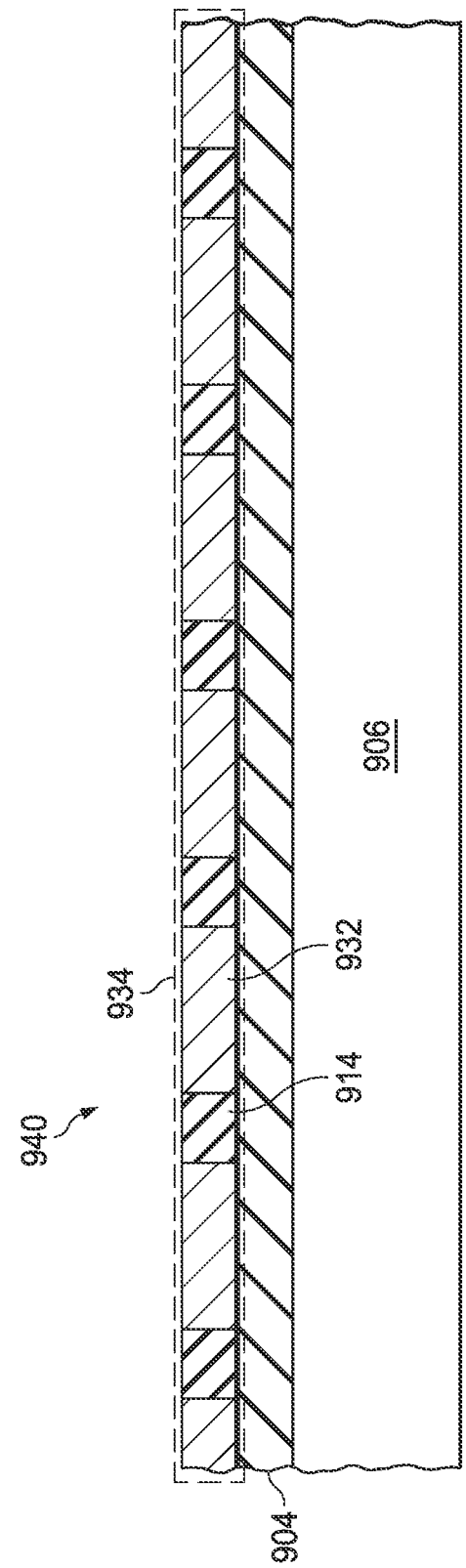

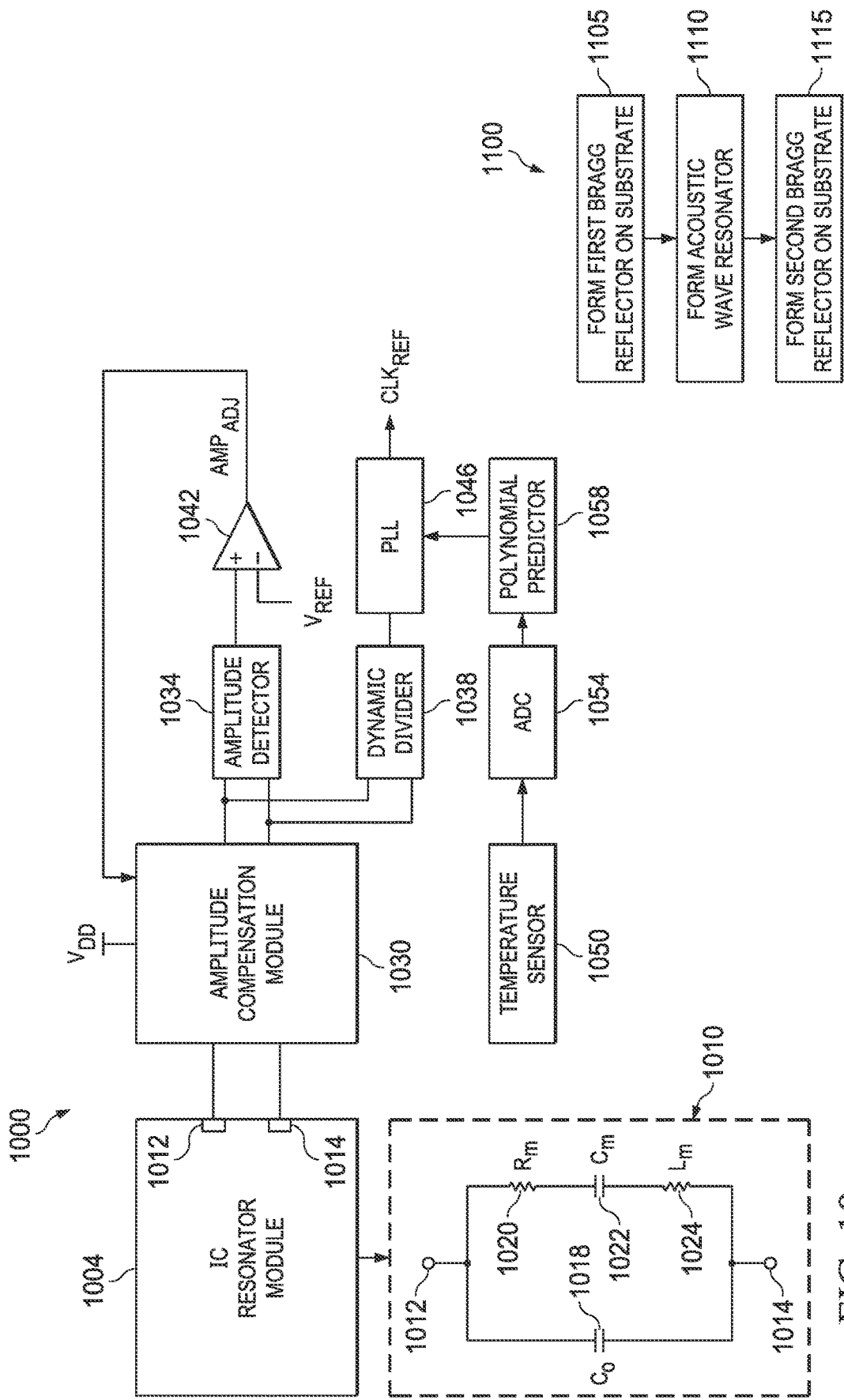

ACOUSTIC RESONATOR

TECHNICAL FIELD

This description relates to acoustic resonators, and more particularly, this description relates to an integrated circuit (IC) resonator module for an IC package.

BACKGROUND

A piezoelectric resonator is an electrical component that implements an acoustic resonator. A piezoelectric resonator is formed with a piezoelectric material that naturally oscillates with greater amplitude at some frequencies, called resonant frequencies, than at other frequencies. An electric device that implements an acoustic resonator has two resonant frequencies, a series resonance frequency, $f_s$ and a parallel resonance frequency, $f_p$. At the series resonance frequency, $f_s$, the acoustic resonator has the lowest impedance, and at the parallel resonance frequency, $f_p$, the acoustic resonator has a greatest impedance.

A bulk acoustic wave (BAW) resonator is an electromechanical device in which a standing acoustic wave is generated by an electrical signal in a bulk of a piezoelectric material. In some examples, a BAW resonator includes a piezoelectric material, such as quartz, aluminum nitride (AlN), or zinc oxide (ZnO) sandwiched between two metallic electrodes. The resonate (natural) frequency of the piezoelectric material and the thickness of the piezoelectric material are employable as design parameters to obtain a desired operating frequency. BAW resonators moves signals perpendicular relative to a piezoelectric thin film sandwiched between two electrode layers that serve as acoustic mirrors. When a frequency is introduced into the a BAW resonator, the structure resonates. The BAW resonator stores the maximum acoustic energy, doing so with a high electrical quality factor (Q), and mechanical vibration is converted and output as a low-noise electrical signal.

SUMMARY

A first example relates to an integrated circuit (IC) resonator module for an IC package. The IC resonator module includes an acoustic resonator having a surface. The IC resonator module also includes a Bragg reflector being adhered to the first surface of the acoustic resonator. The Bragg reflector includes low impedance layers formed of a first material with a first acoustic impedance and a high impedance layer formed of a second material with a second acoustic impedance, the second acoustic impedance being greater than the first acoustic impedance. The Bragg reflector also includes a Bragg grating layer formed of randomly spaced patches of the second material separated by vias filled with the first material.

A second example relates to a method for forming an acoustic resonator for an IC package. The method includes forming a Bragg reflector on a substrate. The Bragg reflector includes a Bragg grating layer having randomly spaced patches of a first material with a first acoustic impedance, the randomly spaced patches being separated by vias filled with a second material having a second acoustic impedance, wherein the first acoustic impedance is greater than the second acoustic impedance. The method also includes forming an acoustic wave resonator on the Bragg reflector.

BRIEF DESCRIPTION OF THE DRAWINGS

FIGS. 3A-3D illustrate a sequence depicting a diffraction of an acoustic wave as the acoustic wave passes through a Bragg grating layer.

FIGS. 9A-9H illustrate an example sub-method for forming a Bragg reflector with a Bragg grating layer.

FIG. 10 illustrates a block diagram of an oscillator circuit for generating a temperature stable reference clock signal that employs an IC resonator module.

FIG. 11 illustrates a flowchart of an example method for forming an IC resonator module.

DETAILED DESCRIPTION

This description relates to an IC resonator module for an integrated circuit (IC) package. The IC resonator module is a solid state device that includes an acoustic resonator, such as a BAW resonator or a surface acoustic wave (SAW) resonator. The acoustic resonator includes a piezoelectric material, such as aluminum nitride (AlN) that is sandwiched between two electrodes. The electrodes are configured to be coupled to nodes (e.g., terminals) of the IC resonator module to enable the IC resonator module to communicate with external components, such as other components on the IC package, or components external to the IC package.

The acoustic resonator includes a first surface and a second surface, with the first surface opposing the second surface. A first Bragg reflector is adhered to the first surface of the acoustic resonator, and a second Bragg reflector is adhered to the second surface of the acoustic resonator. The first and second Bragg reflectors include low impedance layers formed of a first material with a first acoustic impedance. In some examples, the first material is silicon dioxide ($SiO_2$). Also, the first and second Bragg reflectors includes a high impedance layer (or multiple high impedance layers) formed of a second material with a second acoustic impedance, the second acoustic impedance being greater than the first acoustic impedance. In various examples, the second material is tungsten (W) or titanium tungsten (TiW). Further, the first Bragg reflector includes a Bragg grating layer formed of randomly spaced patches of the second material separated by vias filled with the first material. The IC resonator module is mounted on a substrate, such that the first Bragg reflector (that includes the Bragg grating layer) overlays the substrate. Also, in some examples, an endcap (e.g., IC packaging material, such as plastic) is applied to the IC resonator module such that the second Bragg reflector underlies the endcap.

In operation, electrical signals applied to the electrodes of the acoustic resonator cause acoustic waves to emanate from the piezoelectric layer and toward the substrate and the endcap. The first and second Bragg reflectors reflect portions of the acoustic waves back towards the piezoelectric material to acoustically isolate the IC resonator module from the substrate. However, some portions of the acoustic waves propagate across the first Bragg reflector and reach the Bragg grating layer. The vias of the Bragg grating layer diffract these portions of the acoustic waves to alter their trajectory, preventing the substrate from reflecting these acoustic waves and preventing the introduction of spurious mode signals at the acoustic resonator.

Figure 1:
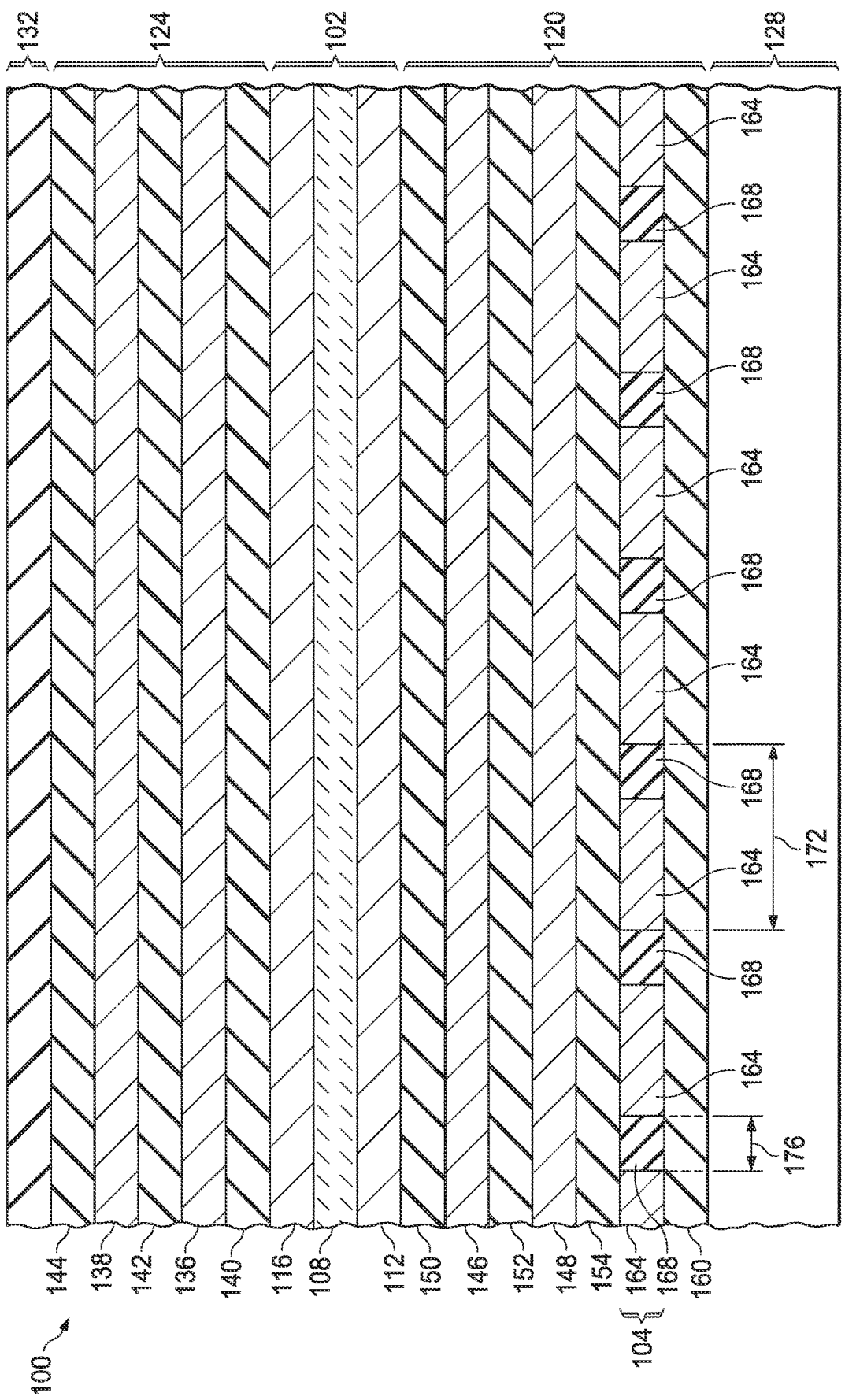
FIG. 1 illustrates a diagram of an example of an integrated circuit (IC) resonator module for an IC package.

FIG. 1 illustrates an IC resonator module 100 that includes a acoustic resonator 102, such as a BAW resonator or a SAW resonator that includes a Bragg grating layer 104 to suppress spurious mode signals. The IC resonator module 100 is employable in an oscillator circuit to generate a reference clock signal, such that the IC resonator module 100 is coupled to an external circuit in some examples. Also, the IC resonator module 100 is employable in a filter. In some examples, the IC resonator module 100 is mounted in an IC package. The acoustic resonator 102 is implemented as a solid state device with a series resonant frequency, $f_s$ and a parallel resonant frequency, $f_p$. The acoustic resonator 102 includes a piezoelectric layer 108 formed of piezoelectric film, such as a layer of aluminum nitride (AlN) or zinc oxide (ZnO). The piezoelectric layer 108 is sandwiched between a first electrode 112 that is coupled to a first node (e.g., a first terminal) of the IC resonator module 100 and a second electrode 116 that is coupled to a second node (e.g., a second terminal) of the IC resonator module 100. The first electrode 112 and the second electrode 116 are formed of a conductive material, such as copper (Cu), aluminum (Al), gold (Au), platinum (Pt) or molybdenum (Mo).

The IC resonator module 100 includes a first Bragg reflector 120 and a second Bragg reflector 124. In the orientations illustrated, the first Bragg reflector 120 underlies the acoustic resonator 102 and the second Bragg reflector 124 overlays the acoustic resonator 102. Thus, in the example illustrated, the first Bragg reflector 120 is adhered to a first surface of the acoustic resonator 102 and the second Bragg reflector 124 is adhered to a second surface of the acoustic resonator 102, and the second surface opposes the first surface. However, in other examples, other orientations are possible. The first Bragg reflector 120 is sandwiched between the acoustic resonator 102 and a substrate 128. In some examples, the substrate 128 is formed of silicon, such as silicon (Si) in a silicon wafer of the IC resonator module 100. The second Bragg reflector 124 is sandwiched between the acoustic resonator 102 and an endcap 132. The endcap 132 can be formed of cap material, such as silicon dioxide ($SiO_2$) or other nonconductive material.

The first Bragg reflector 120 and the second Bragg reflector 124 are formed with alternating layers of material with a low acoustic impedance, such as silicon dioxide ($SiO_2$) and a material with a high acoustic impedance, such as tungsten (W) or titanium tungsten (TiW). That is, the material with the high acoustic impedance has a greater acoustic impedance than the material with the lower acoustic impedance. More particularly, in the example illustrated, the second Bragg reflector 124 includes a first high impedance layer 136 and a second high impedance layer 138 that are formed with the high acoustic impedance material and a first low impedance layer 140, a second low impedance layer 142 and a third low impedance layer 144 formed of the low acoustic impedance material. In other examples, the second high impedance layer 138 and the second low impedance layer 142 are omitted, such that the first Bragg reflector 120 is formed with one high impedance layer, namely the first high impedance layer 136 and one low impedance layer, namely, the first low impedance layer 140. In still other examples, the second Bragg reflector 124 is considered to be a combination of two Bragg reflectors that each include a single high impedance layer and a single low impedance layer.

In the example illustrated, the first Bragg reflector 120 also includes a first high impedance layer 146 and a second high impedance layer 148 of the high acoustic impedance material and a first low impedance layer 150, a second low impedance layer 152 and a third low impedance layer 154 of the low acoustic impedance material. Furthermore, the first Bragg reflector 120 includes the Bragg grating layer 104 and a fourth low impedance layer 160 of the low acoustic impedance material. That is, the Bragg grating layer 104 is sandwiched between the third low impedance layer 154 and the fourth low impedance layer 160 of low acoustic impedance material of the first Bragg reflector 120. The thickness of layers of the first Bragg reflector 120 and the second Bragg reflector 124 is about one quarter wavelength of an acoustic wave traversing a corresponding layer of the first Bragg reflector 120 and the second Bragg reflector 124 at the parallel resonant frequency, $f_p$ of the acoustic resonator 102, and is characterized with Equation 1. Unless otherwise stated, in this description, 'about' a value means+/−10 percent of the stated value.

$$T_{Layer} = \frac{1}{4}\lambda = \frac{1}{4}\left(\frac{v}{f_p}\right) \qquad \text{Equation 1}$$

wherein:
$T_{Layer}$ is the thickness of a given layer of the Bragg reflector;
$\lambda$ is the wavelength of an acoustic wave traversing the given layer;
v is the acoustic velocity of the given layer; and
$f_p$ is the parallel resonance of the acoustic resonator.

In one example, the parallel resonant frequency, $f_p$ is 2.53 Gigahertz (GHz). In this example, suppose the first low impedance layer 150, the second low impedance layer 152, the third low impedance layer 154 and the fourth low impedance layer 160 have an acoustic velocity of 4554 m/s. Using Equation 1, the thickness, $T_{Layer}$ for the first low impedance layer 150, the second low impedance layer 152, the third low impedance layer 154 and the fourth low impedance layer 160 is about 450 nanometers (nm). Additionally, the first high impedance layer 146 and the second high impedance layer 148 have a different acoustic velocity, and therefore would have a different thickness that is defined by Equation 1. Similarly, the Bragg grating layer 104 also has a different acoustic velocity and would therefore also have a different thickness that is defined by Equation 1.

In other examples, the second high impedance layer 148 and the third low impedance layer 154 are omitted, such that the second Bragg reflector 124 is formed with one high impedance layer, namely the first high impedance layer 146 and two impedance layers, namely, the first low impedance layer 150 and the second low impedance layer 152. In still other examples, the first Bragg reflector 120 is considered to be a combination of two Bragg reflectors, in which one includes a single high impedance layer and a single low impedance layer and another includes a single low impedance layer and the Bragg grating layer 104.

The Bragg grating layer 104 includes patches 164 of the material with the high acoustic impedance separated by vias 168 that are filled with the material with the low acoustic impedance. In some examples, the patches 164 are distributed randomly. More specifically, a sum of a width of a patch 164 and a via 168 defines a pitch of the patches 164 indicated by arrows 172. Moreover, a distance between two of the patches 164 defines a width of the vias 168, as indicated by arrows 176. The pitch of the patches 164 and/or the width of the vias 168 of the Bragg grating layer 104 is selected from a range based on a wavelength of an acoustic wave at the parallel resonant frequency, $f_p$ of the acoustic resonator 102. Moreover, the pitch of the patches 164 and/or the width of the vias 168 are randomly distributed within the range.

In operation, responsive to electrical signals received that the first electrode 112 and the second electrode 116, the piezoelectric layer 108 converts electrical energy into acoustic waves that are propagated toward the endcap 132 and the substrate 128. The first Bragg reflector 120 and the second Bragg reflector 124 acoustically isolate the acoustic waves emanating from the acoustic resonator 102 from the substrate 128 and the endcap 132. More particularly, the alternating impedances of the first Bragg reflector 120 and the second Bragg reflector 124 cause the acoustic waves propagating across the first Bragg reflector 120 and the second Bragg reflector 124 to be partially reflected in a direction away from the substrate 128 and the endcap 132. Accordingly, the reflected portions of the acoustic waves do not reach the substrate 128 or the endcap 132, such that the acoustic waves (vibrations) emanating from the acoustic resonator 102 are isolated from the substrate 128 and the endcap 132.

However, portions of the acoustic waves propagating through the first Bragg reflector 120 reach the substrate 128. Conventionally, these portions are reflected back to the acoustic resonator 102 through substrate resonance. The substrate resonance functions as a spurious mode to the main resonant mode of the resonator resulting in frequency instability. In some conditions, this spurious mode inhibits the functionality of the resonator for precise timing applications, such as in a phase locked loop (PLL) or oscillators.

Figure 2:
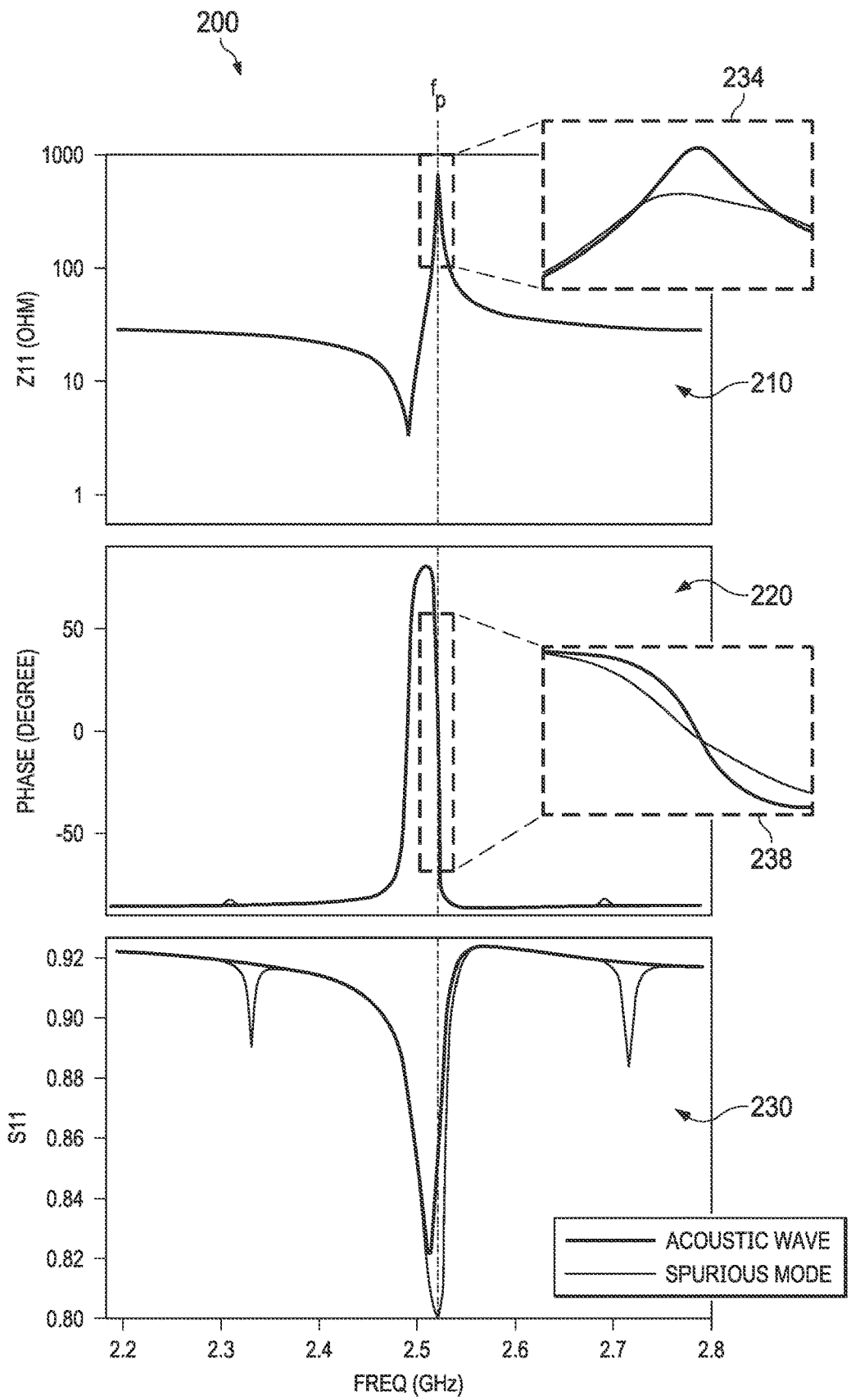
FIG. 2 illustrates graphs that demonstrate the impact of a spurious mode as a function of frequency in an acoustic resonator.

FIG. 2 illustrates graphs 200 that demonstrate the impact of the spurious mode as a function of frequency of an acoustic resonator with a parallel resonance frequency, $f_p$ of 2.53 gigahertz (GHz). More particularly, the graphs 200 includes a first graph 210 that plots an impedance (in Ohms) as a function of frequency, a second graph 220 that plots a phase (in degrees) as a function of frequency and a third graph that plots reflection of a signal (in decibels (dB)) as a function of frequency. For purposes of comparison, each of the first graph 210, the second graph 220 and the third graph 230 employ the same horizontal axis (frequency). The graphs 200 each include a plot of an acoustic wave and a plot of a spurious mode (e.g., reflected from a substrate).

FIG. 2 includes a first window 234 that illustrates a zoomed in view of the first graph 210 near the parallel resonance frequency, $f_p$. FIG. 2 also includes a second window 238 that illustrates a zoomed in view of the second graph 220 near the parallel resonance frequency, $f_p$. As illustrated in the first window 234 and the second window 238, and the third graph 230 the spurious mode distorts the properties of the acoustic wave near the parallel resonance frequency, $f_p$, thereby reducing the accuracy of a clock signal (or other signal) generated based on the parallel resonance frequency, $f_p$ of the acoustic resonator.

Referring back to FIG. 1, to curtail the impact of such spurious modes, the Bragg grating layer 104 diffracts the portions of the acoustic waves propagating through the first Bragg reflector 120 that reach the substrate 128. More particularly, the pattern of the patches 164 and the vias 168 of the Bragg grating layer 104 diffract an acoustic wave that reaches the Bragg grating layer 104 such that a diffracted acoustic wave is propagated to the substrate 128. More specifically, selecting random spacing (pitch and width) based on a lateral mode wavelength of the acoustic waves breaks local standing wave mode buildup while maintaining the isolation of the first Bragg reflector 120. Stated differently, randomly distributing the patches 164 throughout the Bragg grating layer 104 inhibits the ability of acoustic waves reaching the Bragg grating layer 104 from forming a lateral mode. Moreover, the diffracted acoustic wave has altered trajectory from a direction normal to a surface of the acoustic resonator 102, which prevents excitation of a substrate longitudinal mode at the substrate 128.

FIGS. 3A-3D illustrate a sequence illustrating the diffraction of an acoustic wave 300 as the acoustic wave 300 passes through a Bragg grating layer 304 that represents the Bragg grating layer 104 of FIG. 1 and continues toward a substrate 308 that represents the substrate 128 of FIG. 1. The Bragg grating layer 304 includes patches 312 of a material with a high acoustic impedance (e.g., TiW) separated by vias 316 filled with a material with a low acoustic impedance (e.g. $SiO_2$).

Figure 3A:
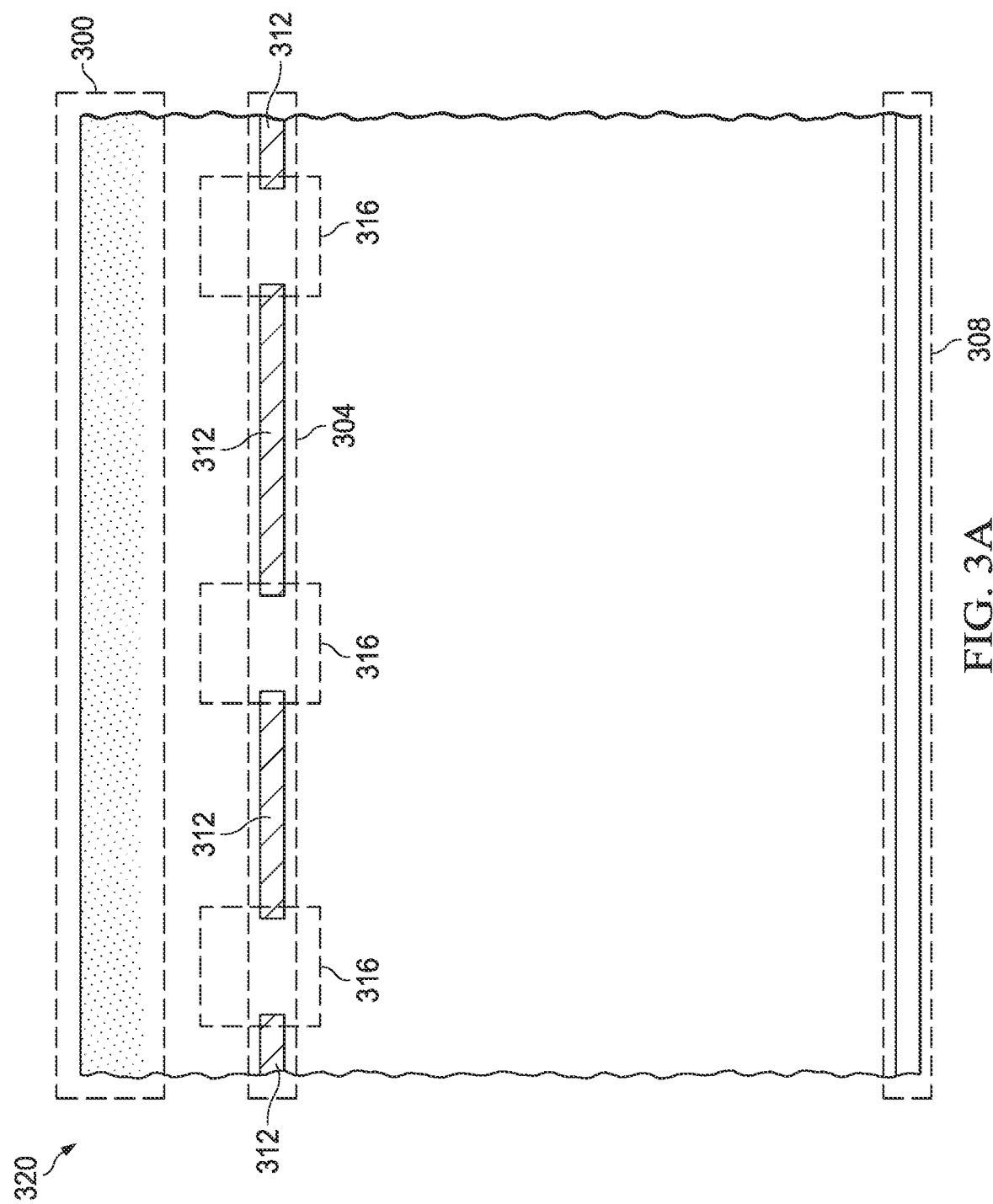
Figure 3C:
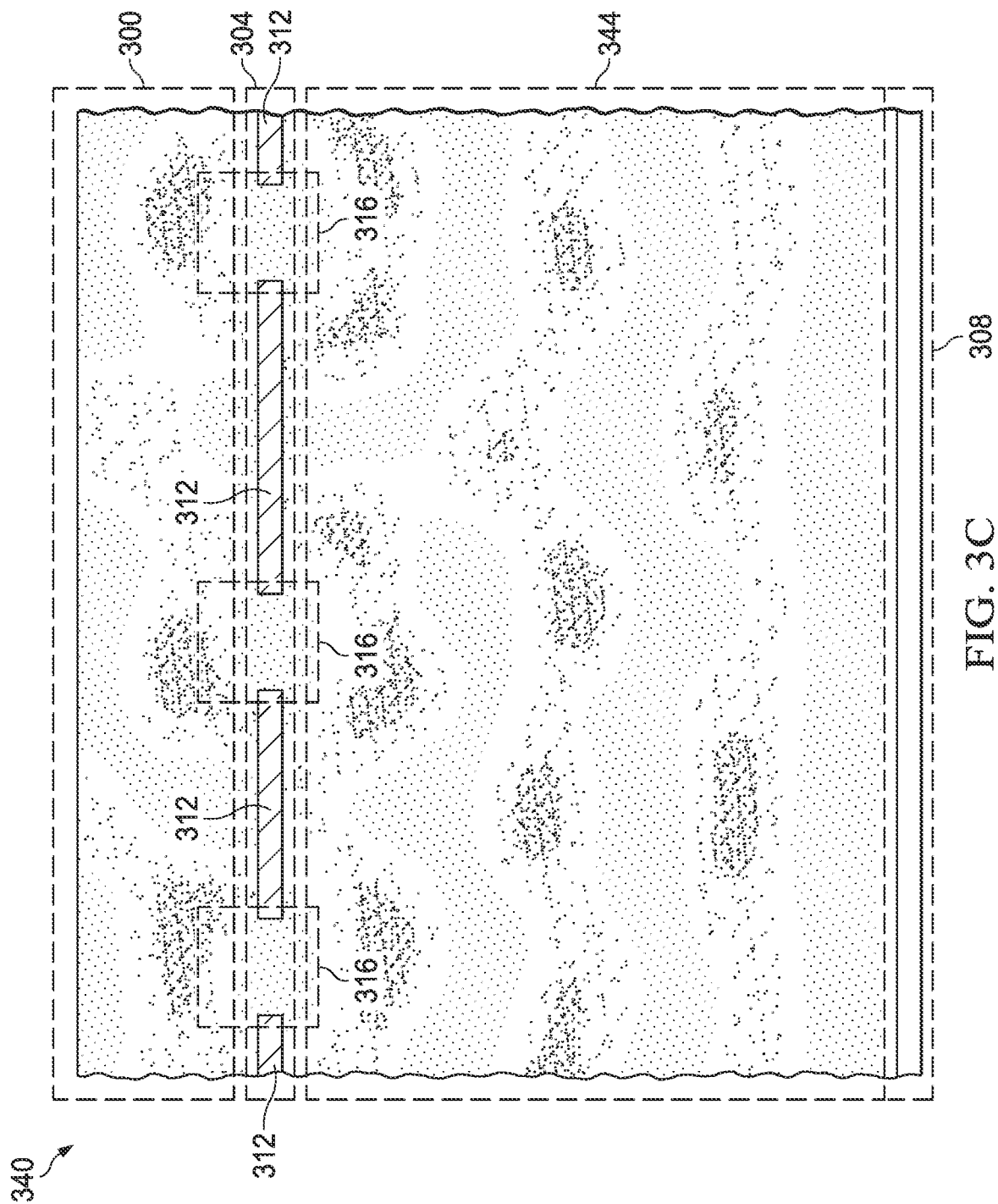
Figure 3D:
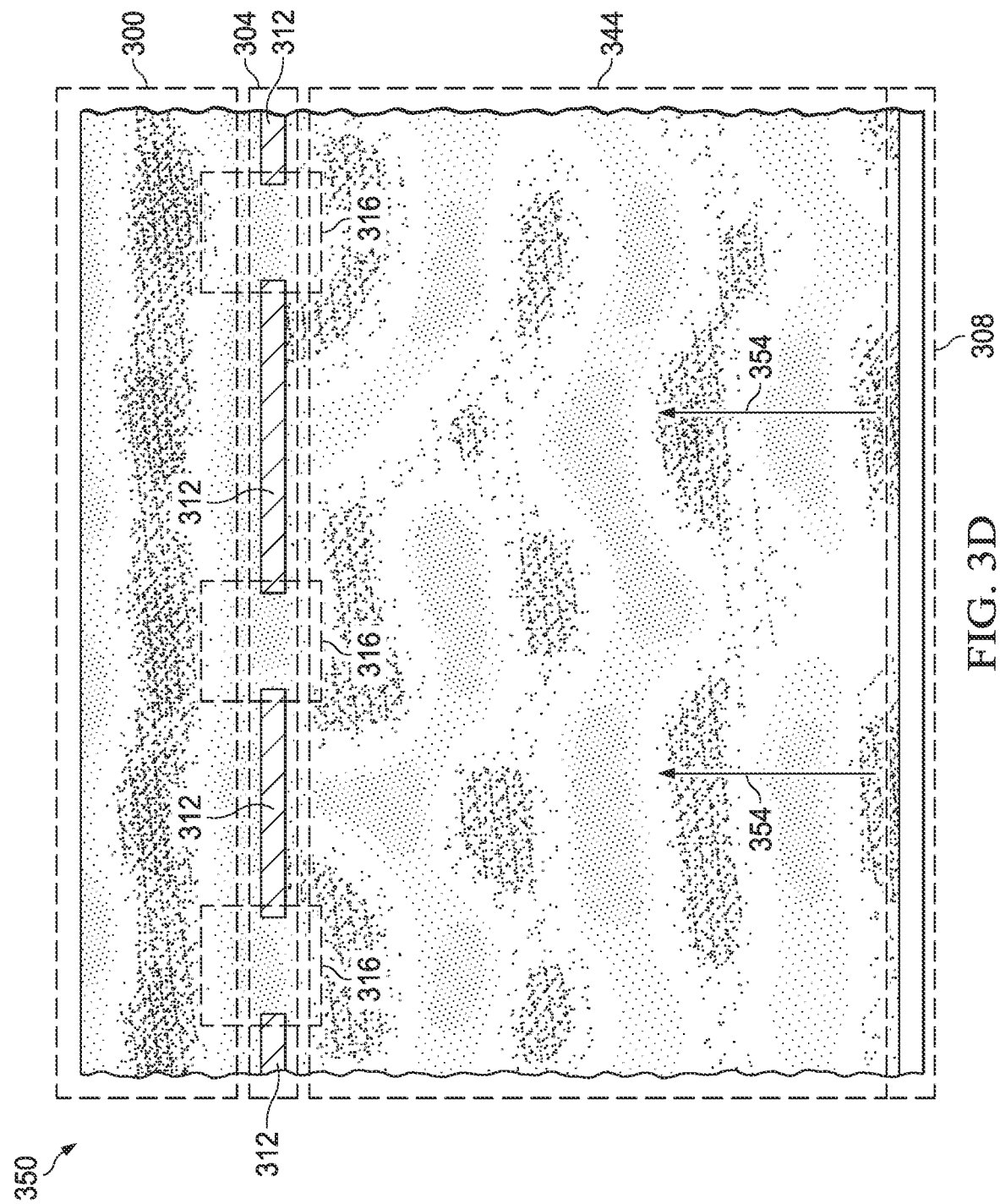

As illustrated in FIG. 3A, at 320, the acoustic wave 300 is relatively coherent prior to reaching the Bragg grating layer 304. As illustrated by FIG. 3B, at 330, the acoustic wave 300 reaches the Bragg grating layer 304 and portions of the acoustic wave 300 are transmitted through the vias 316 and other portions intersect the patches 312. Moreover, as illustrated by FIG. 3C, at 340 portions of the acoustic wave 300 that are pass through the vias 316 form a set of diffracted waves 344 that propagate toward the substrate 308. Also, the portions of the acoustic wave 300 that intersect patches 312 are reflected back toward the resonator. As the diffracted waves 344 travel toward the substrate 308, portions of the diffracted waves 344 combine. Also, as illustrated by FIG. 3D, at 350, the diffracted waves 344 intersect the substrate 308 and are reflected back toward the Bragg grating layer 304. However, because of the diffraction, the reflected waves have a new trajectory, such as a trajectory indicated by arrows 354 causing the reflected portions of the diffracted waves 344 to intersect with the patches 312, which prevents these reflected portions from reaching the acoustic resonator and causing spurious modes that distort a parallel resonance or series resonance of the acoustic resonator.

Figure 4:
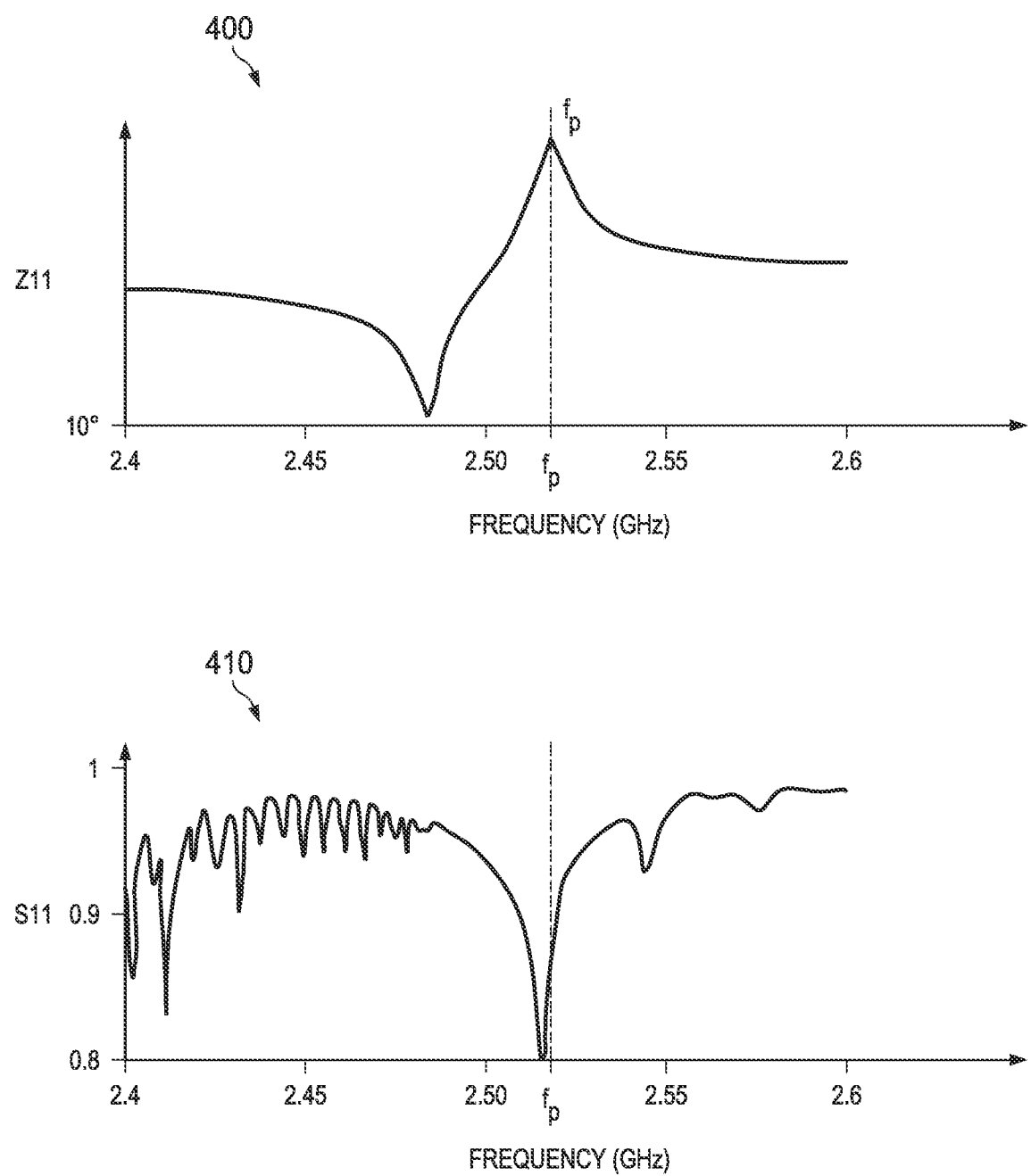
FIG. 4 illustrates an impedance graph and a gain graph that represent a measured impedance and a measured gain as a function of frequency for an acoustic resonator that overlays a Bragg grating layer.

FIG. 4 illustrates an impedance graph 400 and a gain graph 410 that represent a measured impedance and a measured refraction as a function of frequency for the acoustic resonator 102 of FIG. 1 that overlays the Bragg grating layer 104. In FIG. 4, it is presumed that the Bragg grating layer 104 of FIG. has a width (distance between the patches 164) of 2.5 micrometers (μm). As illustrated by the impedance graph 400, the acoustic resonator has a parallel resonant frequency, $f_p$ of about 2.53 GHz. Moreover, the spurious mode from acoustic waves being reflected by the substrate 128 of FIG. 1 have been suppressed.

Referring back to FIG. 1, inclusion of the Bragg grating layer 104 increases stability of the acoustic resonator 102. In particular, stability is increased in situations where the acoustic resonator 102 is operating at or near the parallel resonant frequency, fp.

Figure 5:
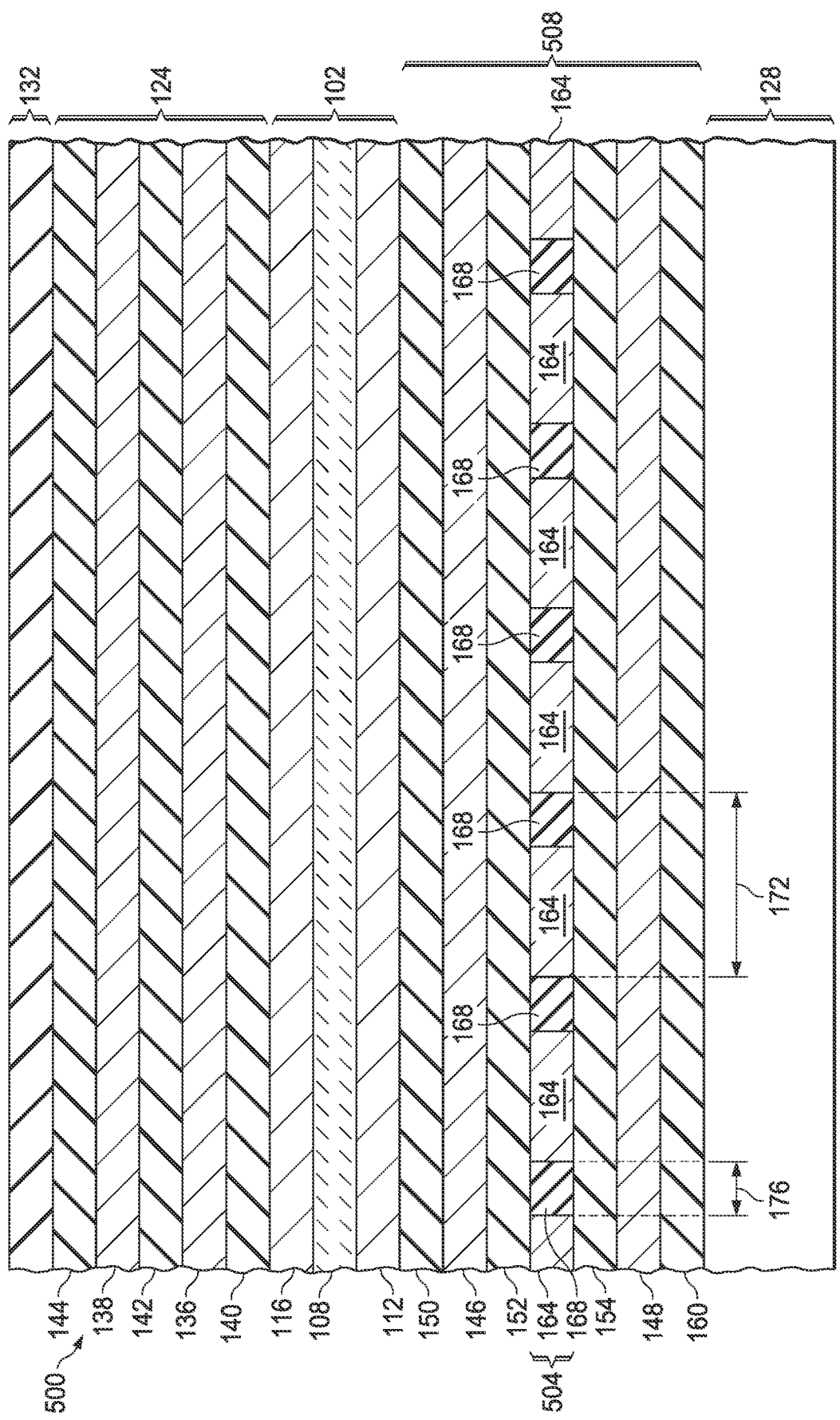
FIG. 5 illustrates an alternative example of an IC resonator module for an IC package.

FIG. 5 illustrates an alternative example of an IC resonator module 500 that is similar to the IC resonator module 100 of FIG. 1. Thus, for purposes of simplification of explanation, FIGS. 1 and 5 employ the same reference numbers to denote the same structure. Moreover, some reference numbers are not re-introduced. The IC resonator module 500 includes a Bragg grating layer 504 as an element of a first Bragg reflector 508. The Bragg grating layer 504 includes the patches 164 formed of the material with a high acoustic impedance (e.g., W or TiW) and the vias 168 filled with the material with a low acoustic impedance (e.g., SiO$_2$). However, the first Bragg reflector 508 is formed such that the Bragg grating layer 504 is positioned between the first high impedance layer 146 and the second high impedance layer 148 of the material with the high acoustic impedance. As compared to the first Bragg reflector 120 of FIG. 1, the first Bragg reflector 508 of FIG. 5 provides lower frequency stability characteristics.

FIGS. 6A-6D illustrate additional alternative examples of an IC resonators that are similar to the IC resonator module 100 of FIG. 1, but have fewer layers. Thus, for purposes of simplification of explanation, FIGS. 1 and 6A-6D employ the same reference numbers to denote the same structure. Moreover, some reference numbers are not re-introduced.

Figure 6A:
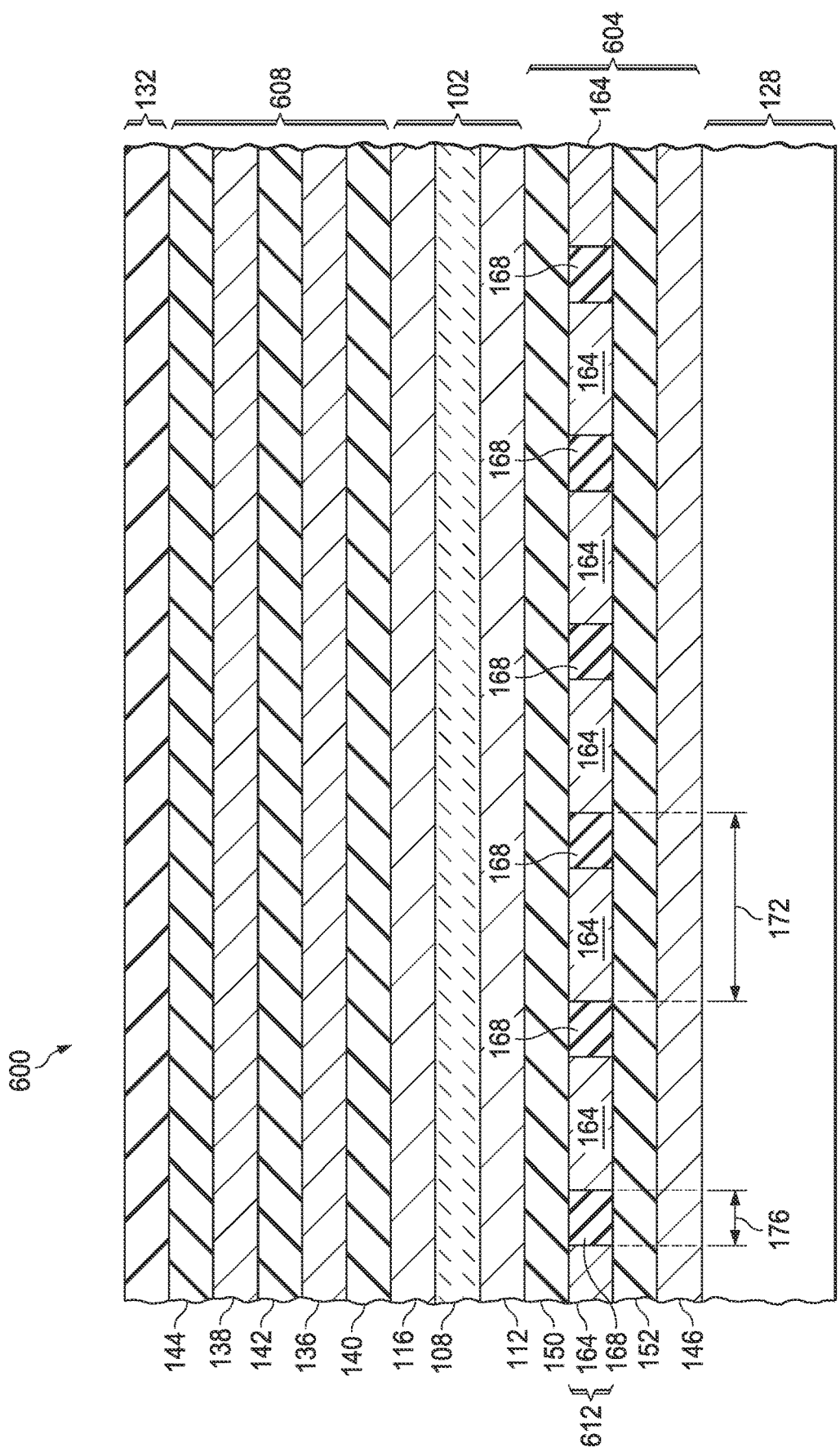
FIGS. 6A-6D illustrate additional alternative examples of an IC resonator for an IC package.

FIG. 6A illustrates an IC resonator module 600 that includes a first Bragg reflector 604 on a first side of the acoustic resonator 102 and a second Bragg reflector 608 on a second side of the acoustic resonator 102, opposing the first side. As noted, in some examples, a Bragg reflector has at least a single high impedance layer and a single low impedance layer. Thus, in FIGS. 6A-6D, the Bragg reflectors that are illustrated can be representative of multiple Bragg reflectors combined (e.g., in a stacked configuration).

The first Bragg reflector 604 includes a Bragg grating layer 612 sandwiched between the first low impedance layer 150 and the second low impedance layer 152. The Bragg grating layer 612 comprises patches 164 separated by vias 168, as explained with respect to FIG. 1. As explained with respect to FIG. 1, the arrows 172 define a pitch of patches 164 and the arrows 176 define a width of the vias 168. In the example illustrated, it is presumed that the patches 164 and the vias 168 are spaced periodically. The first Bragg reflector 604 also includes a first high impedance layer 146 that underlies the second low impedance layer 152 and overlays the substrate 128.

The second Bragg reflector 608 includes the first low impedance layer 140, the first high impedance layer 136, the second low impedance layer 142, the second high impedance layer 138 and the third low impedance layer 144. The endcap 132 overlays the third low impedance layer 144. As compared to the IC resonator module 500 of FIG. 5, the IC resonator module 600 has one less low impedance layer and one less high impedance layer.

Figure 6B:
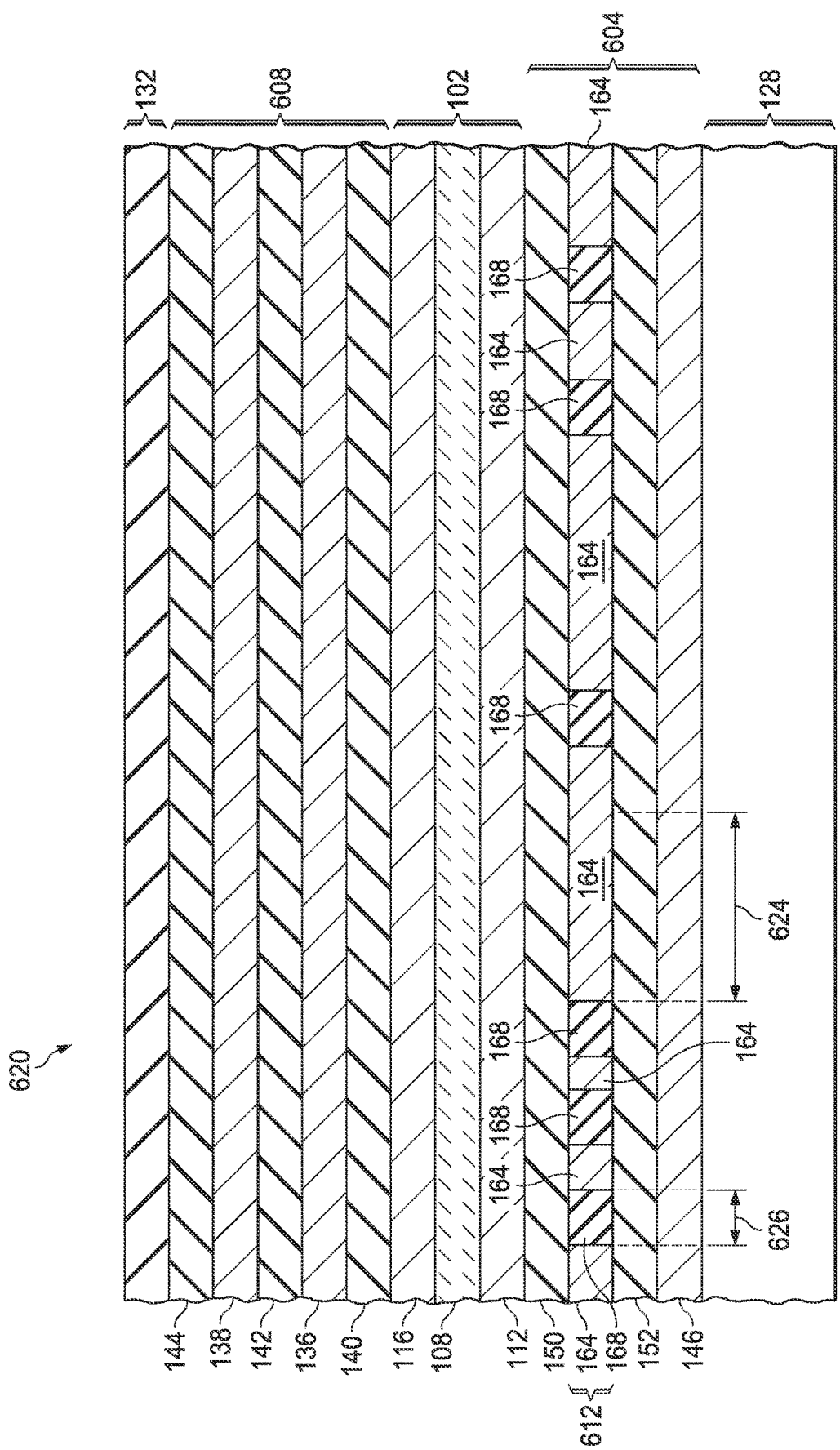

FIG. 6B illustrates an IC resonator module 620 that is similar to the IC resonator module 600 of FIG. 6A. In the IC resonator module 620, the Bragg grating layer 612 has patches 164 that are randomly spaced, such that a pitch of the patches 164, indicated by arrows 624 and a width of the vias 168, indicated by the arrows 626, varies across a length of the IC resonator module 620.

Figure 6C:
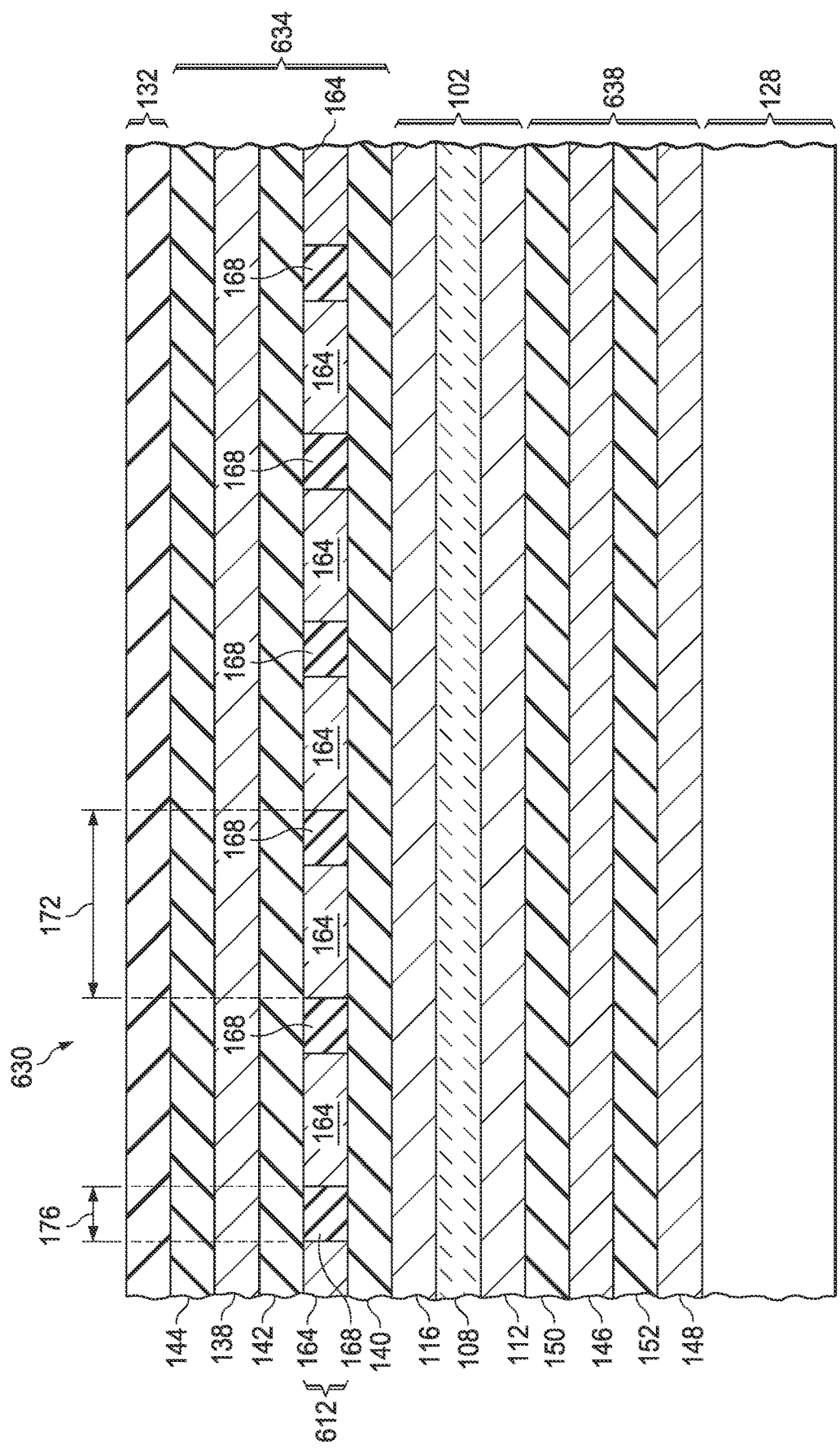

FIG. 6C illustrates an IC resonator module 630 that includes a first Bragg reflector 634 on a first side of the acoustic resonator 102 and a second Bragg reflector 638 on a second side of the acoustic resonator 102, opposing the first side. As compared to the IC resonator module 600 of FIG. 6A and the IC resonator module 620 of FIG. 6B, the first and second sides of the acoustic resonator 102 are reversed, in which the first side of the acoustic resonator is a topside and a second side is a bottom side, in one orientation. The first Bragg reflector 634 includes the Bragg grating layer 612 sandwiched between the first low impedance layer 140 and the second low impedance layer 142.

Additionally, the first Bragg reflector 634 includes the first high impedance layer 136 sandwiched between the second low impedance layer 142 and the third low impedance layer 144. The endcap 132 overlays the third low impedance layer 144. The Bragg grating layer 612 comprises patches 164 separated by vias 168, as explained with respect to FIG. 1. As explained with respect to FIG. 1, the arrows 172 define a pitch of patches 164 and the arrows 176 define a width of the vias 168.

The second Bragg reflector 638 includes the first low impedance layer 150, the second low impedance layer 152, the first high impedance layer 146 and the 148 interleaved. Moreover, the second high impedance layer 148 overlays the substrate 128. Thus, in the example illustrated by the IC resonator module 630, the second side (the bottom side) of the acoustic resonator 102 does not include a Bragg grating layer.

Figure 6D:
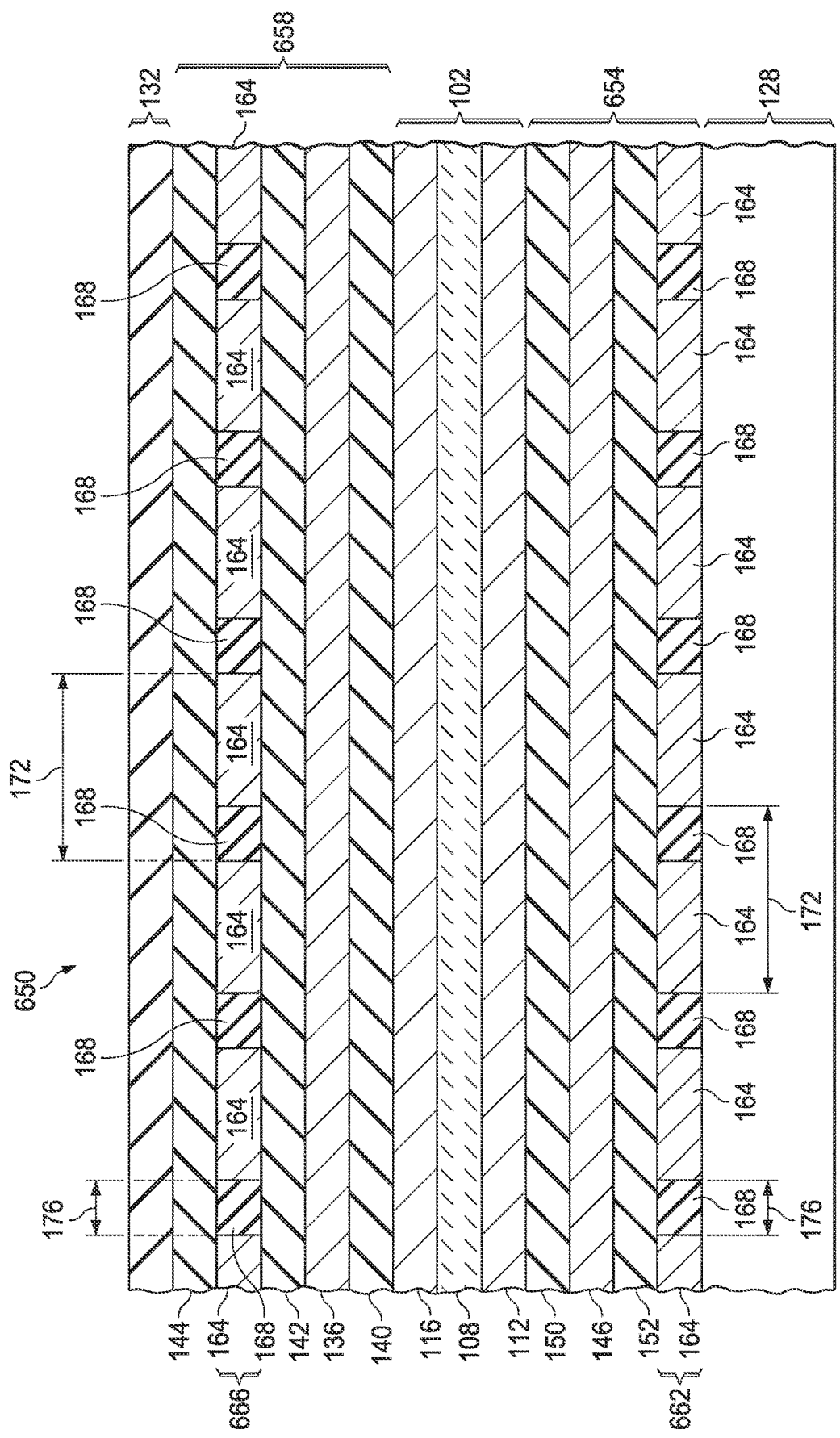

FIG. 6D illustrates an IC resonator module 650 that includes a first Bragg reflector 654 on a first side of the acoustic resonator 102 and a second Bragg reflector 658 on a second side of the acoustic resonator 102, opposing the first side. The first Bragg reflector 654 and the second Bragg reflector 658 include a Bragg grating layer. More specifically, the first Bragg reflector 654 includes a first Bragg grating layer 662 and the second Bragg reflector 658 includes a second Bragg grating layer 666. In some examples, the first Bragg grating layer 662 and the second Bragg grating layer 666 are implemented as instances of the Bragg grating layer 612 of FIGS. 6A-6C. Thus, the first Bragg grating layer 662 and the second Bragg grating layer 666 include patches 164 separated by vias 168. Moreover, the pitch of the patches 164 is defined by the arrows 172 and the width of the vias 168 are defined by the arrows 176.

The first Bragg reflector 654 includes the first high impedance layer 146 sandwiched between the first low impedance layer 150 and the second low impedance layer 152. Also, the first Bragg grating layer 662 underlays the second low impedance layer 152 and overlays the substrate 128. The second Bragg reflector 658 includes the first high impedance layer 136 sandwiched between the first low impedance layer 140 and the second low impedance layer 142. Additionally, the second Bragg grating layer 666 is sandwiched between the second low impedance layer 142 and the third low impedance layer 144. The endcap 132 overlays the third low impedance layer 144.

As compared to the IC resonator module 600 of FIG. 6A, the IC resonator module 650 of FIG. 6D includes multiple Bragg grating layers, namely the first Bragg grating layer 662 and the second Bragg grating layer 666. Thus, the IC resonator module 650 increases diffraction of acoustic waves traversing the first Bragg reflector 654 and the second Bragg reflector 658 at a cost of increasing processing time in forming the IC resonator module 650.

Figure 7:
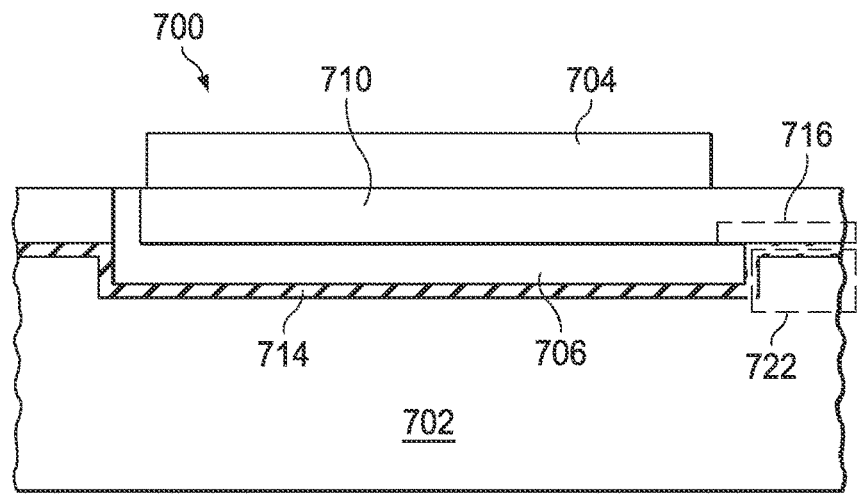
FIG. 7 illustrates an IC package that includes a cavity silicon-on-insulator (C-SOI) wafer with an IC resonator module mounted thereon.

FIG. 7 illustrates an IC package 700 that includes a cavity silicon-on-insulator (C-SOI) wafer 702 with an IC resonator module 704 mounted thereon, such as the IC resonator module 100 of FIG. 1, the IC resonator module 500 of FIG. 5, the IC resonator module 600 of FIG. 6A, the IC resonator module 620 of FIG. 6B, the IC resonator module 630 of FIG. 6C or the IC resonator module 650 of FIG. 6D. Accordingly, the IC resonator module 704 includes a Bragg grating layer, such as the Bragg grating layer 104 of FIG. 1, the Bragg grating layer 504 of FIG. 5, the Bragg grating layer 612 of FIGS. 6A-6C or the first Bragg grating layer 662 and the second Bragg grating layer 666 of FIG. 6D. The C-SOI wafer 702 is formed with a SOI technology where a handle wafer includes a pre-etched cavity 706. The cavity 706 is alternatively referred to as a pattern. The IC resonator module 704 is mounted on a substrate 710 (e.g., the substrate 128 of FIG. 1) that overlays a portion of the cavity 706. A dielectric material 714 lines a top portion of the wafer 702, including the cavity 706. Moreover, a region 716 of the substrate 710 overlays a pillar 722 of the wafer 702.

By including the cavity 706 in the wafer 702 mechanical stress of the IC resonator module 704 is isolated. However, due to the contact at the region 716 of the substrate 710 and the pillar 722, other methods for curtailing spurious modes of the substrate 710, such as roughing a bottom surface of the substrate 710 are difficult to implement. However, inclusion of the Bragg grating layer, such as the Bragg grating layer 104 of FIG. 1 or the Bragg grating layer 504 of FIG. 5 obviates the need for modification to the substrate 710.

Figure 8A:
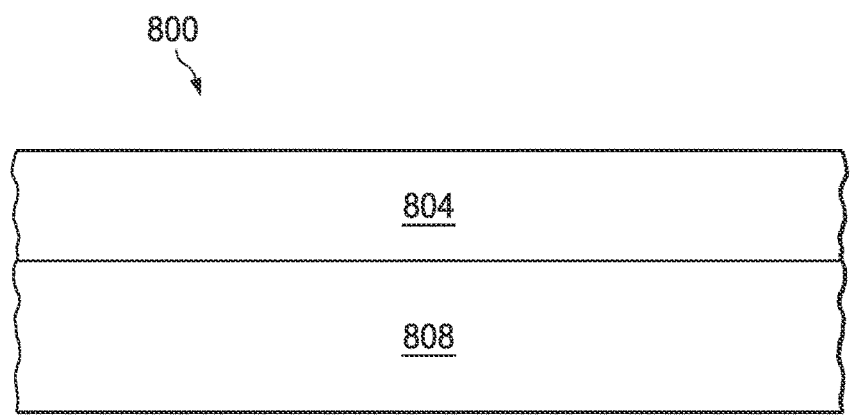
FIGS. 8A-8D illustrate a method for forming an IC package that includes an IC resonator module.

FIGS. 8A-8D illustrate a method for forming an IC package that includes an IC resonator module, such as the IC resonator module 100 of FIG. 1, the IC resonator module 500 of FIG. 5, the IC resonator module 600 of FIG. 6A, the IC resonator module 620 of FIG. 6B, the IC resonator module 630 of FIG. 6C or the IC resonator module 650 of FIG. 6D. As illustrated in FIG. 8A, at 800, a first Bragg reflector 804 is adhered to a substrate 808. In some examples, the first Bragg reflector 804 is implemented with the first Bragg reflector 120 of FIG. 1 and the substrate 808 is implemented with the substrate 128 of FIG. 1.

Figure 8B:
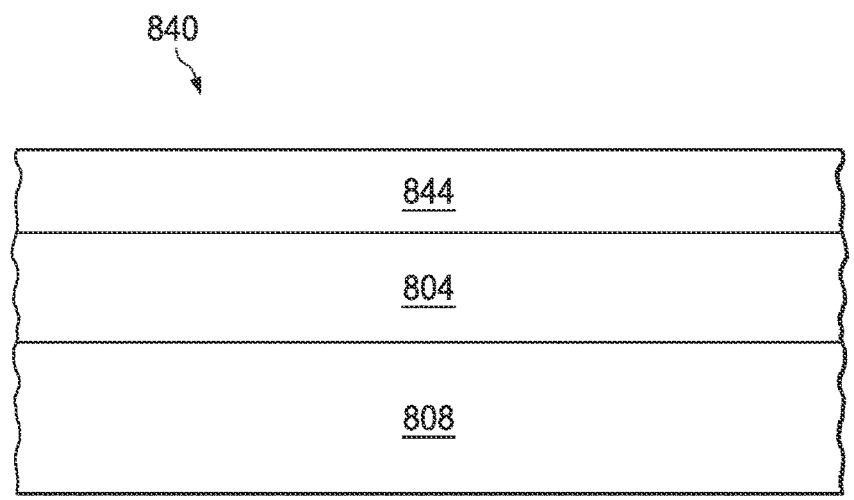
Figure 8C:
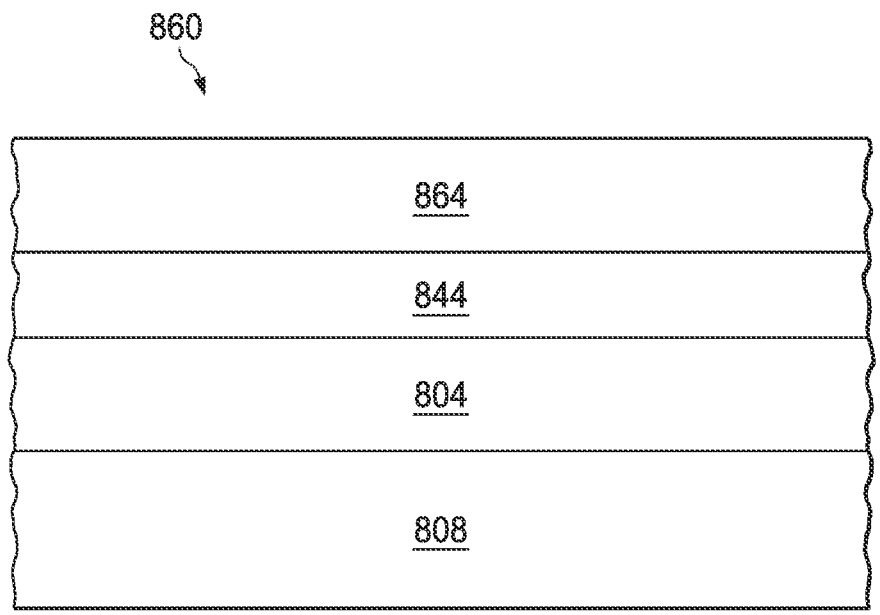
Figure 8D:
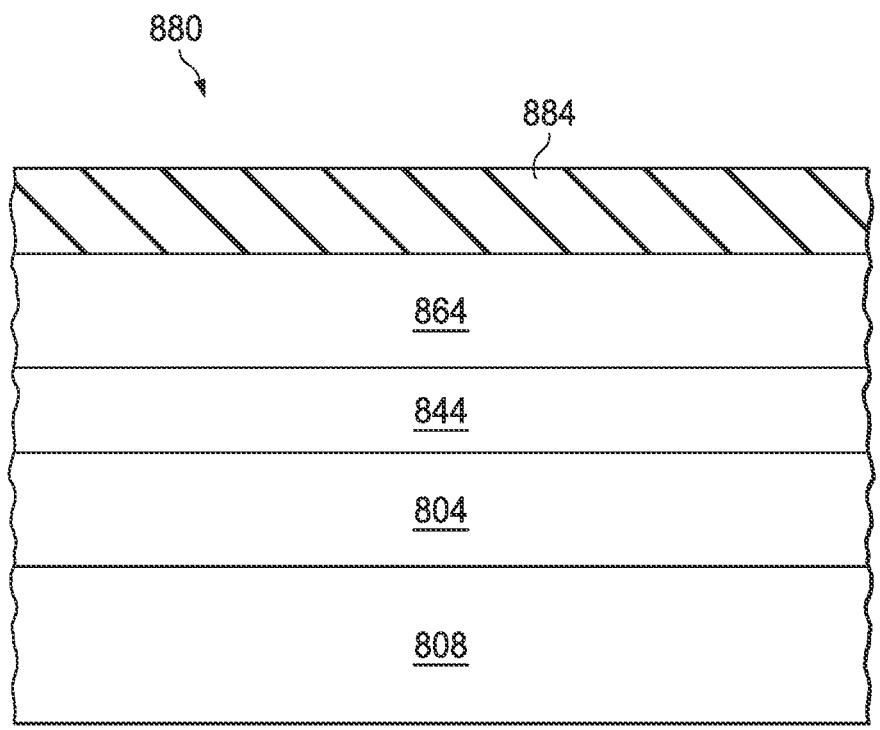

As illustrated in FIG. 8B, at 840, an acoustic wave resonator 844 is formed on the first Bragg reflector 804. The acoustic wave resonator 844 is implemented as a solid state resonator, such as BAW resonator or a SAW resonator. In some examples, the acoustic wave resonator 844 is implemented as the acoustic resonator 102 of FIG. 1. As illustrated in FIG. 8C, at 860, a second Bragg reflector 864 is formed on the acoustic wave resonator 844. Also, as illustrated in FIG. 8D, at 880, an endcap 884 for the IC resonator module is formed on the second Bragg reflector 864.

Figure 9A:
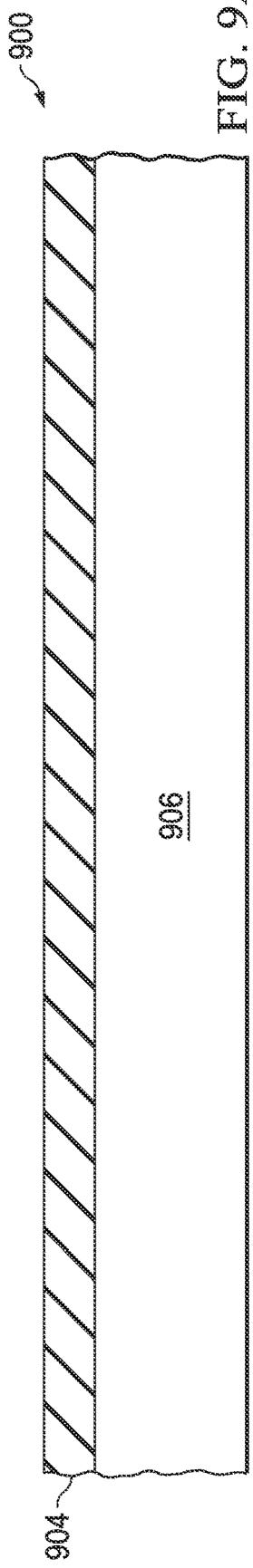
Figure 9B:
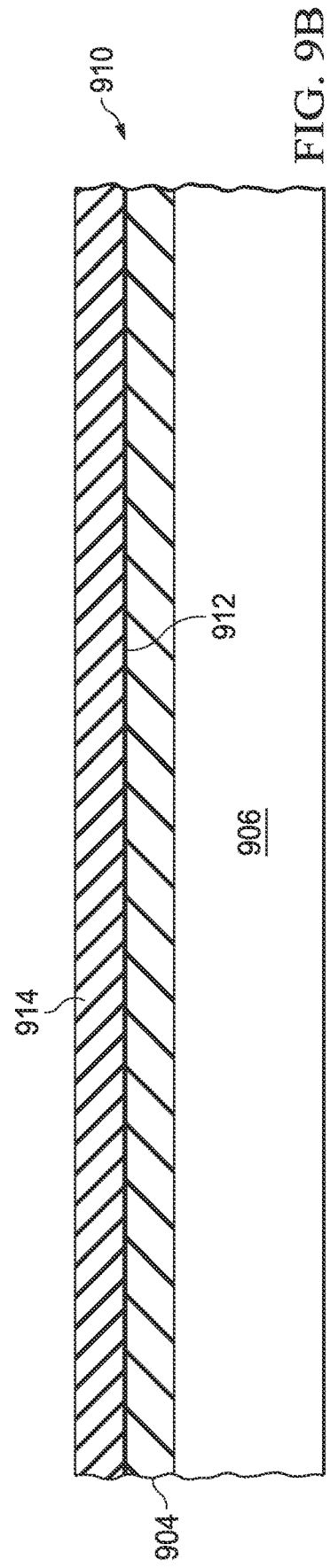

FIGS. 9A-9H illustrate an example sub-method for forming the first Bragg reflector 804 of FIGS. 8A-8D that includes a Bragg grating layer for an acoustic resonator. Thus, the method illustrated by FIGS. 9A-9H are representative of the operation at 800 of FIG. 8A. As illustrated by FIG. 9A, at 900, a first layer 904 of the first Bragg reflector formed of a material with a low acoustic impedance (e.g., $SiO_2$) is applied to a substrate 906, such as a silicon (Si) substrate. As illustrated by FIG. 9B, at 910, an etch stop 912, such as titanium nitride (TiN) or aluminum copper (AlCu) is applied to the first layer 904 of the Bragg reflector. Also, at 910, a layer 914 of material with the low acoustic impedance is deposited on the etch stop 912. The thickness of the layer 914 is about one-quarter of a wavelength of an acoustic wave traversing the layer 914 at a parallel resonant frequency, $f_p$ of the acoustic resonator, which is equal to one-quarter of an acoustic velocity divided by a parallel resonant frequency, $f_p$ as defined in Equation 1. The layer 914 of the Bragg reflector is employed as a component of the Bragg grating layer.

Figure 9C:
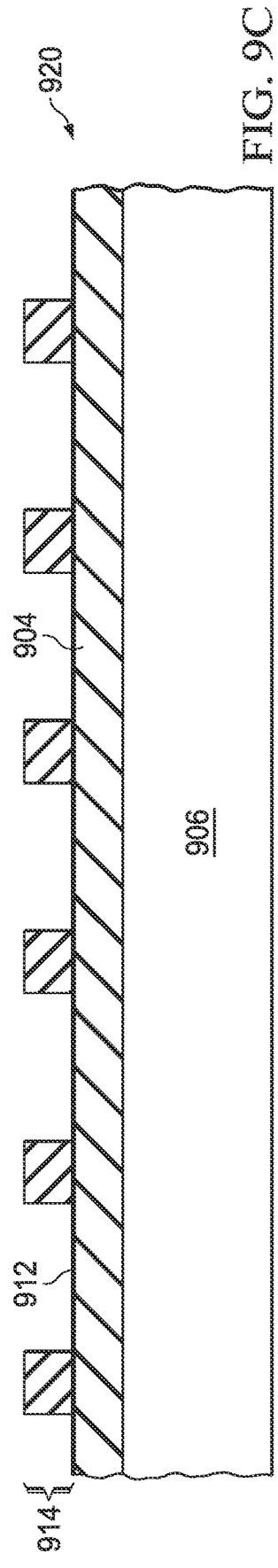

As illustrated in FIG. 9C, at 920 portions of the layer 914 of the material with the low acoustic impedance are etched to the etch stop 912 to form vias for the Bragg grating layer that are filled with the material with the low acoustic impedance. Stated differently, at 920, the layer 914 is etched to provide a set of randomly spaced recesses. As illustrated in FIG. 9D, at 930, a layer 932 of material with a high acoustic impedance (e.g., W or TiW) is deposited over the layer 914 of the material with the low acoustic impedance. As illustrated in FIG. 9E, at 940, the layer 932 of the material with the high acoustic impedance is etched to expose a top surface of the layer 914 of the material with the low acoustic impedance to form patches of the Bragg grating layer. Thus, in combination, the layer 932 of the material with the high acoustic impedance and the layer 914 of the material with the low acoustic impedance forms the Bragg grating layer 934 of the first Bragg reflector for the acoustic resonator. The Bragg grating layer 934 forms the second layer of the Bragg reflector.

Figure 9F:
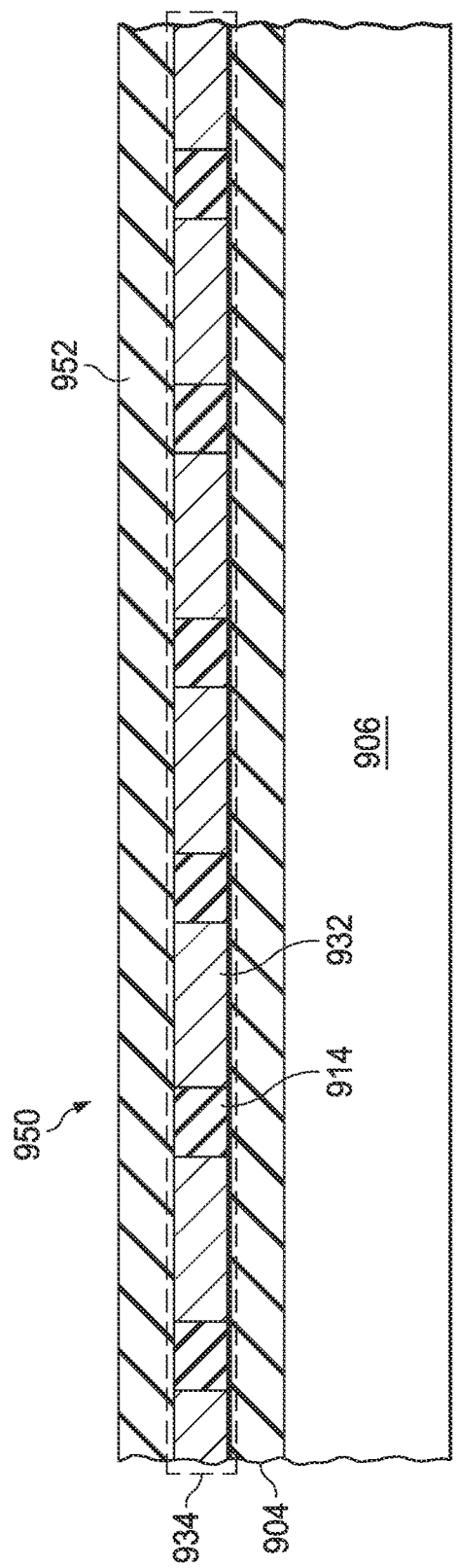
Figure 9G:
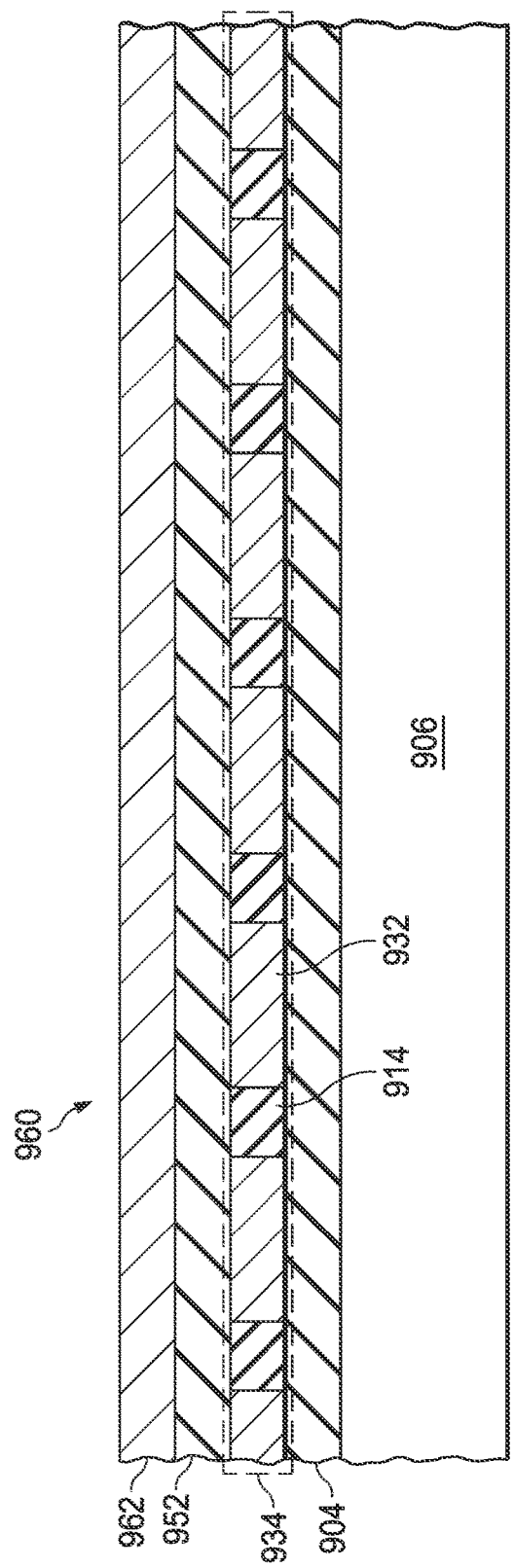
Figure 9H:
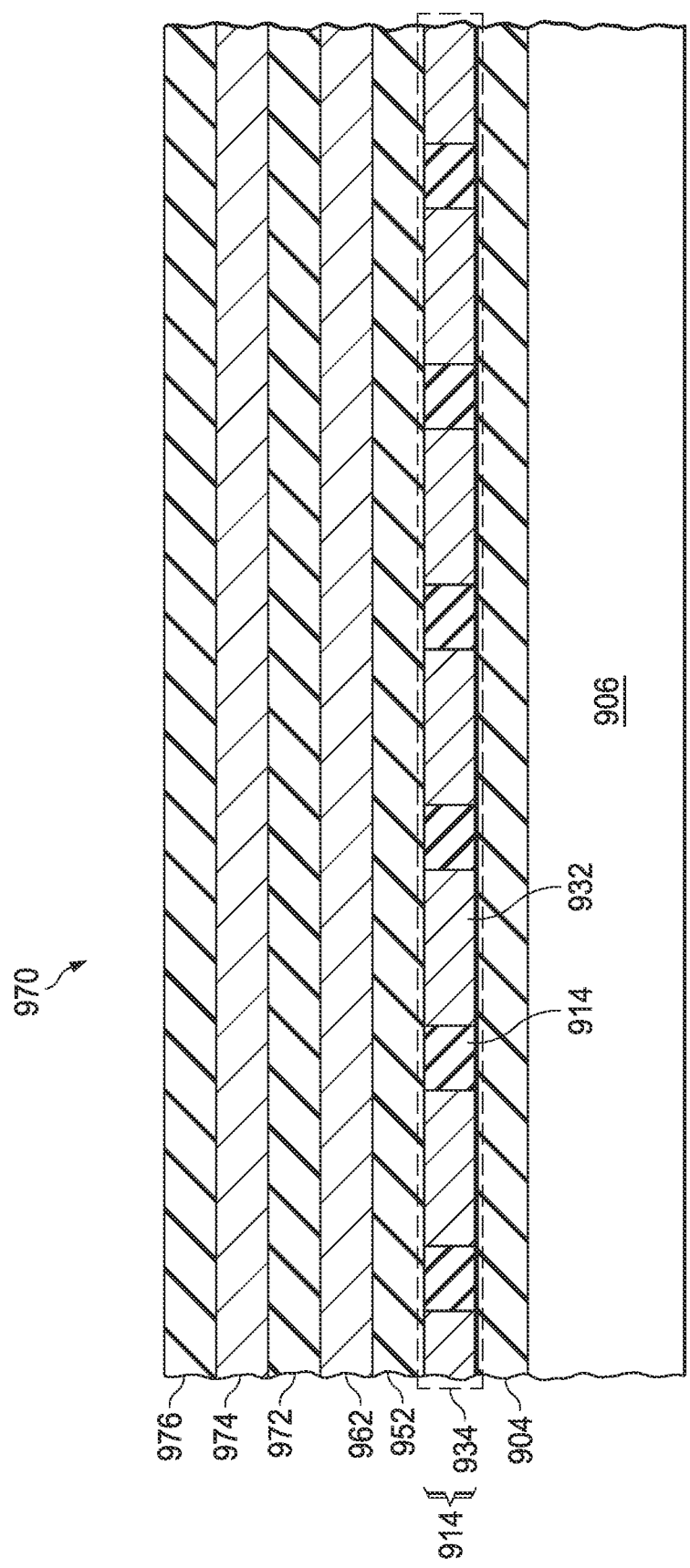

As illustrated in FIG. 9F, at 950, a layer 952 of the material with the low acoustic impedance is deposited on the Bragg grating layer 934 to form a third layer of the Bragg reflector. As illustrated in FIG. 9G at 960, a layer 962 of the material with the high acoustic impedance is deposited on the layer 952 forming a fourth layer of the Bragg reflector. As illustrated in FIG. 9H, at 970 (similar to operations at 950 and 960), a layer 972 of the material with the high acoustic impedance is deposited on the layer 962 to form a fifth layer of the Bragg reflector. Also, at 970, a layer 974 of the material with the high acoustic impedance is deposited on the layer 962 to form a sixth layer of the Bragg reflector. Further, at 970, a layer 976 of the material with the low acoustic impedance is deposited on the layer 974 forming the seventh layer of the Bragg reflector. Accordingly, by executing the operations in FIGS. 9A-9G, the first Bragg reflector (e.g., the first Bragg reflector 120 of FIG. 1) is formed for the IC resonator.

FIG. 10 illustrates a block diagram of an oscillator circuit 1000 for generating a temperature stable reference clock signal, $CLK_{REF}$ that employs an IC resonator module 1004, such as the IC resonator module 100 of FIG. 1 or the IC resonator module 500 of FIG. 5. In some examples, the oscillator circuit 1000 is representative of multiple IC chips operating in concert to generate the reference clock signal, $CLK_{REF}$. In other examples, the oscillator circuit 1000 is implemented on a single IC chip.

The IC resonator module 1004 includes a Bragg grating layer, such as the Bragg grating layer 104 of FIG. 1. The IC resonator module 1004 has an equivalent circuit 1010. The equivalent circuit 1010 includes a first electrode 1012 and a second electrode 1014. For purposes of simplification of explanation, the IC resonator module 1004 also includes the first electrode 1012 and the second electrode 1014. The equivalent circuit 1010 includes a capacitor 1018, $C_0$ coupled to the first electrode 1012 and the second electrode 1014. The capacitor 1018, $C_0$ represents an electrode an lead capacitance. The capacitor 1018, $C_0$ is coupled in parallel with an RLC (resistor inductor capacitor) series circuit formed of a resistor 1020, $R_m$, a capacitor 1022, $C_m$ and an inductor 1024, $L_m$, coupled in series between the first electrode 1012 and the second electrode 1014. As one example, the combination of the resistor 1020, $R_m$, the capacitor 1022, $C_m$ and the inductor 1024, $L_m$ form an equivalent circuit of the acoustic resonator 102, the first Bragg reflector 120 and the second Bragg reflector 124 of FIG. 1.

The first electrode 1012 and the second electrode 1014 of the IC resonator module 1004 are coupled to an amplitude compensation module 1030. The amplitude compensation module 1030 receives an input voltage, $V_{DD}$ and generates a set of complementary square waves (e.g., a set of differential signals) with a frequency of about a parallel resonance frequency, $f_p$ o the IC resonator module 1004 (e.g., 2.53 GHz in one example). Moreover, an amplitude of the set of complementary signals is adjusted based on an amplitude adjustment signal, $AMP_{ADJ}$ (e.g., a feedback signal).

The set of complementary square waves are provided to an amplitude detector 1034 and a dynamic divider 1038. The amplitude detector 1034 detects a difference in amplitude between the complementary square waves, which difference defines an amplitude of the set of complementary square waves. The amplitude detector 1034 provides a signal characterizing the detected amplitude to a non-inverting input of an operational amplifier 1042. Also, a reference voltage, $V_{REF}$ is provided to an inverting input of the operational amplifier 1042. The reference voltage, $V_{REF}$ has a voltage level that defines a desired amplitude of the reference clock signal, $CLK_{REF}$. The operational amplifier 1042 outputs the amplitude adjustment signal, $AMP_{ADJ}$ in response to the signal characterizing the detected amplitude of the complementary square waves and the reference voltage, $V_{REF}$ to form a feedback loop.

The dynamic divider 1038 divides the frequency by a predetermined divider of the complementary square waves and provides a singled-ended, uncompensated square wave that has a frequency reduced relative to the parallel resonant frequency, $f_p$ of the IC resonator module 1004. In one example, the dynamic divider 1038 divides the frequency of the parallel resonant frequency, $f_p$ (e.g., 2.53 GHz) by 52.5 to provide an uncompensated square wave with a frequency of about 48 Megahertz (MHz). The uncompensated square wave is provided to a phase locked loop (PLL) 1046. In some examples, the PLL 1046 is a digital PLL.

A temperature sensor 1050 detects an ambient temperature of an environment and provides an analog temperature signal to an analog-to-digital converter (ADC) 1054. The ADC 1054 generates a digital temperature signal characterizing the analog temperature signal and provides the digital temperature signal to a polynomial predictor 1058. The polynomial predictor 1058 generates a polynomial curve that corresponds to the digital temperature signal and provides the polynomial curve to the PLL 1046.

In operation, if the temperature sensor 1050 registers a threshold temperature change (e.g., 4° C. change) a frequency compensation term is calculated based on the reading at temperature sensor 1050 and a polynomial curve fit to the frequency compensation term is provided to the PLL 1046. Responsive to the polynomial curve fit, the PLL 1046 adjusts a divide ratio to provide the reference clocks signal, $CLK_{REF}$ that is a stable over an operating temperature range.

FIG. 11 illustrates a flowchart of an example method 1100 for forming an IC resonator module, such as the IC resonator module 100 of FIG. 1, the IC resonator module 500 of FIG. 5, the IC resonator module 600 of FIG. 6A, the IC resonator module 620 of FIG. 6B, the IC resonator module 630 of FIG. 6C or the IC resonator module 650 of FIG. 6D. The IC resonator module is employable in an IC package, such as the IC package 700 of FIG. 7.

At 1105, a first Bragg reflector (e.g., the first Bragg reflector 120 of FIG. 1) is formed on a substrate (e.g., the substrate 128 of FIG. 1). The first Bragg reflector includes a Bragg grating layer having randomly spaced patches of a first material with a first acoustic impedance. The randomly spaced patches are separated by vias filled with a second material having a second acoustic impedance, wherein the first acoustic impedance is greater than the second acoustic impedance. In one example, the first material is $SiO_2$ and the second material is TiW.

At 1110, an acoustic wave resonator (e.g., the acoustic resonator 102 of FIG. 1) is formed on the first Bragg reflector. Also, at 1115, a second Bragg reflector (e.g., the second Bragg reflector 124) is formed on the acoustic wave resonator.

Modifications are possible in the described embodiments, and other embodiments are possible, within the scope of the claims.

What is claimed is:
1. An apparatus comprising:
an acoustic resonator;
multiple layers of different impedances that overlap at least partially with the acoustic resonator along an axis; and
a grating layer overlapping at least part of the multiple layers along the axis.
2. The apparatus of claim 1, wherein the multiple layers are part of a Bragg reflector.
3. The apparatus of claim 2, wherein the Bragg reflector is a first Bragg reflector, the apparatus further comprises a second Bragg reflector, where the acoustic resonator is between the first and second Bragg reflectors.
4. The apparatus of claim 2, further comprising a substrate, wherein the Bragg reflector is between the acoustic resonator and the substrate.
5. The apparatus of claim 4, wherein the substrate includes a cavity, and the acoustic resonator and the granting layer overlaps at least part of the cavity.
6. The apparatus of claim 1, wherein the acoustic resonator includes at least one of a bulk acoustic wave (BAW) resonator or a surface acoustic wave (SAW) resonator.
7. The apparatus of claim 1, wherein the grating layer is a first grating layer; and
wherein the apparatus further comprises a second granting layer, and the acoustic resonator is between the first and second granting layers.
8. The apparatus of claim 2, wherein the Bragg reflector includes;
a first high impedance layer;
a second high impedance layer
a first low impedance layer between the first and second high impendance layer; and
wherein the grating layer is separated from the second high impedance layer by a second low impedance layer.
9. The apparatus of claim 2, wherein the Bragg reflector includs;
a first high impedance layer;
a second high impedance layer;
wherein the first high impedance layer and the second high impedance layer are separated by two low impedance layers and the grating layer.
10. The apparatus of claim 1, wherein the grating layer is configurable to diffract acoustic waves emanating from the acoustic resonator.
11. The apparatus of claim 1, wherein the grating layer includes patches that are spaced apart by a distance based on a parallel resonant frequency of the acoustic resonator.
12. The apparatus of claim 1, wherein the acoustic resonator further comprises electrodes configured to be coupled to an external circuit.
13. The apparatus of claim 12, wherein the external circuit is an oscillator circuit.
14. The apparatus of claim 1, wherein the grating layer has a thickness that is about one-quarter of a wavelength of an acoustic wave traversing the grating layer at a parallel resonant frequency of the acoustic resonator.
15. The apparatus of claim 1, wherein the axis is a first axis, and the grating layer includes regions of low and high acoustic impedances along a second axis angled from the first axis.

16. The apparatus of claim 15, wherein the regions of low and high acoustic impedances are distributed randomly or periodically.

17. The apparatus of claim 1, wherein the grating layer includes patches of a material separated by vias.

18. An apparatus comprising:
an acoustic resonator;
multiple layers of different impedances that overlap at least partially with the acoustic resonator along an axis; and
a diffraction layer that overlaps with at least part of the multiple layers along the axis.

19. The apparatus of claim 18, wherein the diffraction layer includes patches of a material separated by vias.

20. The apparatus of claim 19, wherein the patches are periodically or randomly spaced.

21. The apparatus of claim 18, wherein the acoustic resonator includes at least one of a bulk acoustic wave (BAW) resonator or a surface acoustic wave (SAW) resonator.

* * * * *